(12) United States Patent
Liu et al.

(10) Patent No.: US 9,812,451 B2
(45) Date of Patent: Nov. 7, 2017

(54) FIELD EFFECT TRANSISTOR CONTACT WITH REDUCED CONTACT RESISTANCE

(71) Applicant: Taiwan Semiconductor Manufacturing Company, Ltd., Hsin-Chu (TW)

(72) Inventors: Su-Hao Liu, Chiayi County (TW); Yan-Ming Tsai, Miaoli County (TW); Chung-Ting Wei, Hsin-Chu (TW); Ziwei Fang, Hsinchu (TW); Chih-Wei Chang, Hsin-Chu (TW); Chien-Hao Chen, Ilan County (TW); Huicheng Chang, Tainan (TW)

(73) Assignee: TAIWAN SEMICONDUCTOR MANUFACTURING COMPANY, LTD, Hsin Chu (TW)

( * ) Notice: Subject to any disclaimer, the term of this patent is extended or adjusted under 35 U.S.C. 154(b) by 0 days.

(21) Appl. No.: 15/014,318

(22) Filed: Feb. 3, 2016

(65) Prior Publication Data

US 2017/0221894 A1    Aug. 3, 2017

(51) Int. Cl.
| | |
|---|---|
| H01L 21/335 | (2006.01) |
| H01L 27/092 | (2006.01) |
| H01L 21/8238 | (2006.01) |
| H01L 21/265 | (2006.01) |
| H01L 21/324 | (2006.01) |
| H01L 29/45 | (2006.01) |
| H01L 29/16 | (2006.01) |

(Continued)

(52) U.S. Cl.
CPC ...... *H01L 27/092* (2013.01); *H01L 21/26513* (2013.01); *H01L 21/324* (2013.01); *H01L 21/823814* (2013.01); *H01L 21/823828* (2013.01); *H01L 29/16* (2013.01); *H01L 29/165* (2013.01); *H01L 29/167* (2013.01); *H01L 29/1608* (2013.01); *H01L 29/456* (2013.01); *H01L 29/7848* (2013.01)

(58) Field of Classification Search
CPC .................................................... H01L 21/335
See application file for complete search history.

(56) References Cited

U.S. PATENT DOCUMENTS

| | | |
|---|---|---|
| 7,667,271 B2 | 2/2010 | Yu et al. |
| 7,910,453 B2 | 3/2011 | Xu et al. |

(Continued)

*Primary Examiner* — Marvin Payen
(74) *Attorney, Agent, or Firm* — Haynes and Boone, LLP

(57) ABSTRACT

The present disclosure provides a method that includes providing a semiconductor substrate having a first region and a second region; forming a first gate within the first region and a second gate within the second region on the semiconductor substrate; forming first source/drain features of a first semiconductor material with an n-type dopant in the semiconductor substrate within the first region; forming second source/drain features of a second semiconductor material with a p-type dopant in the semiconductor substrate within the second region. The second semiconductor material is different from the first semiconductor material in composition. The method further includes forming first silicide features to the first source/drain features and second silicide features to the second source/drain features; and performing an ion implantation process of a species to both the first and second regions, thereby introducing the species to first silicide features and the second source/drain features.

20 Claims, 21 Drawing Sheets

(51) Int. Cl.
*H01L 29/165* (2006.01)
*H01L 29/167* (2006.01)
*H01L 29/78* (2006.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2014/0001574 A1 | 1/2014 | Chen et al. |
| 2014/0110755 A1 | 4/2014 | Colinge |
| 2014/0151812 A1 | 6/2014 | Liaw |
| 2016/0254358 A1* | 9/2016 | Tsai ................ H01L 21/76897 257/327 |

* cited by examiner

FIELD EFFECT TRANSISTOR CONTACT WITH REDUCED CONTACT RESISTANCE

BACKGROUND

In advanced technology nodes of integrated circuit industry, the critical dimensions of semiconductor devices become smaller and smaller. Various new compositions and structures are adopted. For examples, a high k dielectric material and metal are used to form a gate stack of a field-effect transistor (FET) such as a metal-oxide-semiconductor field-effect transistor (MOSFET). Three dimensional (3D) fin field effect transistors (FINFETs) are also used. Contact resistance plays a key factor to boost $I_{on}/I_{off}$ performance on FinFET devices, especially below N10 generation. Even though silicide is formed on the source and drain to reduce the contact resistance. However, the existing method cannot effectively reduce the contact resistance while maintaining other parameters of the devices and the overall of the device performance. Especially, the contact area is constrained due to the device scaling. Higher implantation for dopant boosting may improve the contact resistance but the high concentration dopant may diffuse to the channel and shift threshold voltage.

What is needed is a semiconductor structure with reduced contact resistance and the method making the same to address the above issues

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
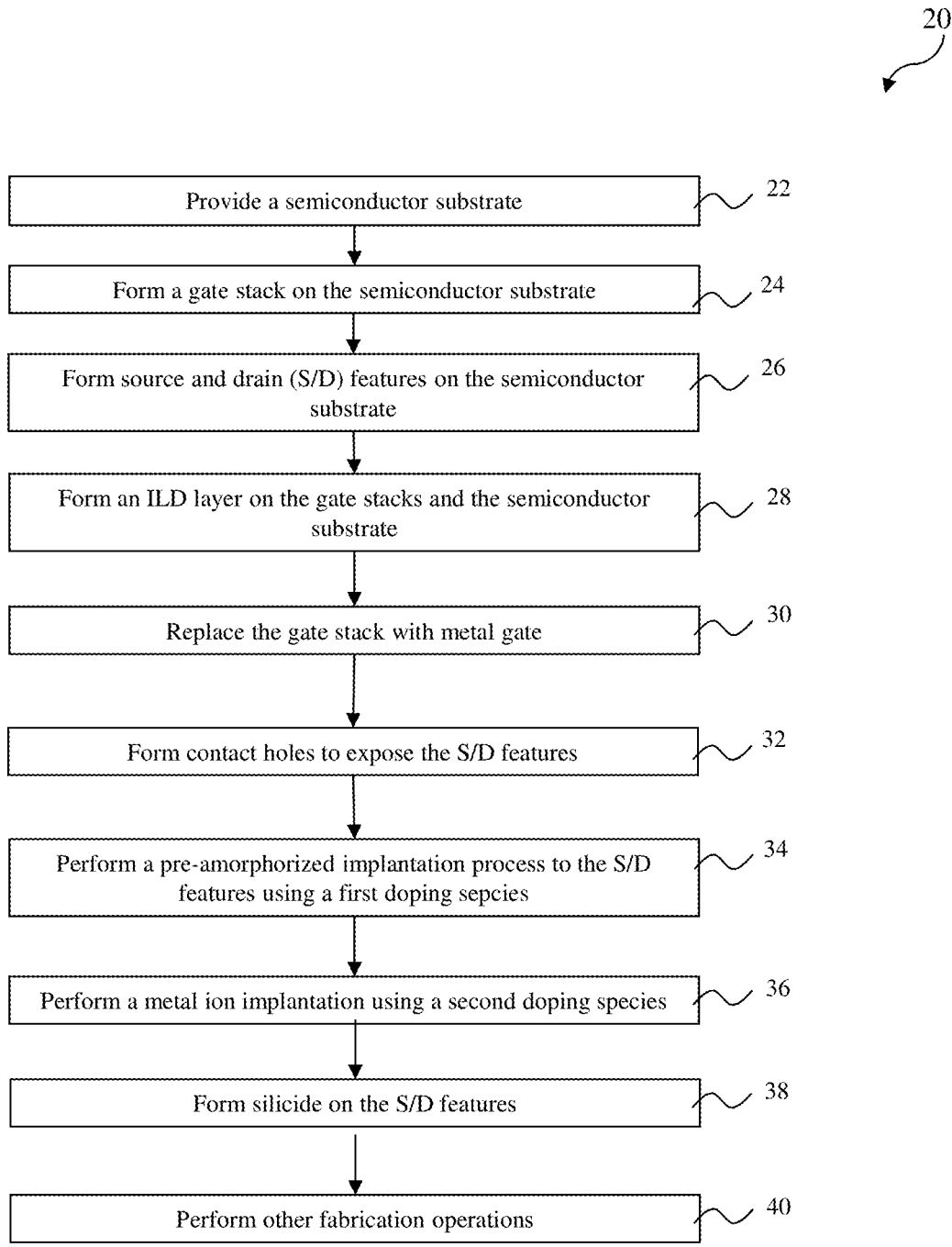
FIG. 1 is a flowchart of a method for making a semiconductor structure constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 20 making a semiconductor structure having both n-type and p-type field effect devices constructed according to aspects of the present disclosure. FIGS. 2A, 2B, and 3-8 are sectional views of a semiconductor structure 50 at various fabrication stages in accordance with some embodiments. The semiconductor structure 50 and the method 20 of making the same are collectively described with reference to FIGS. 1, 2A, 2B and 3 through 8.

Figure 2A:
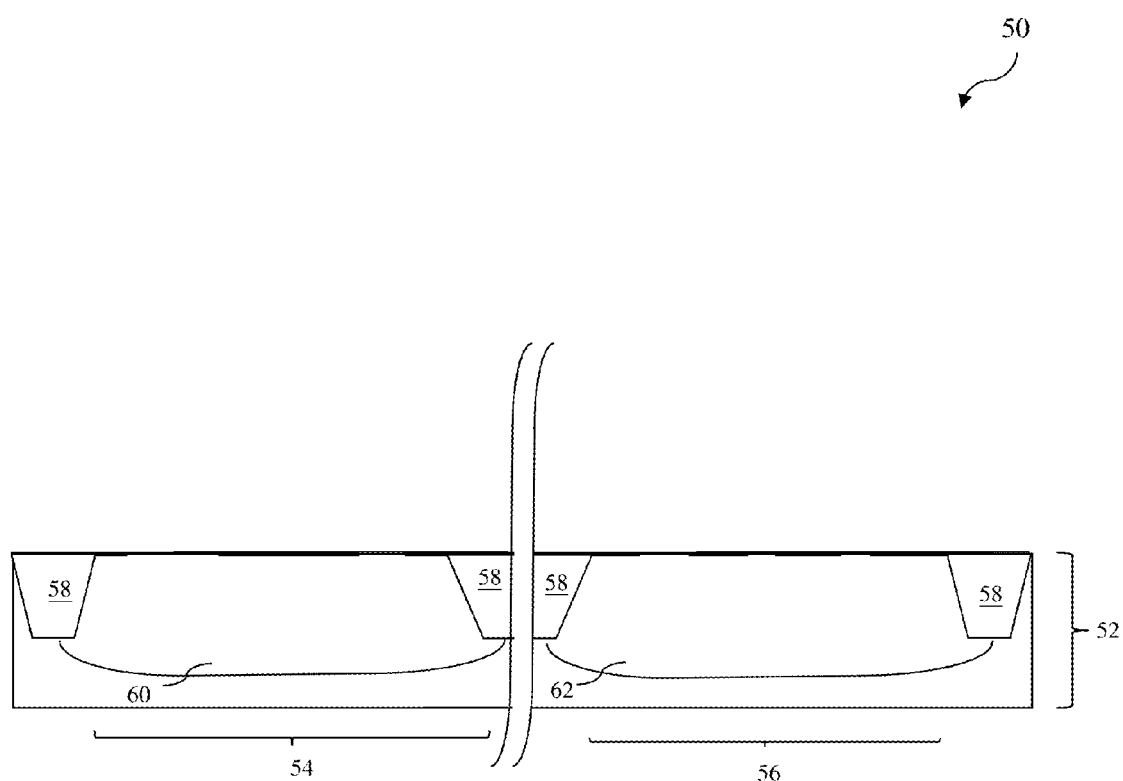
FIGS. 2A, 3, 4, 5, and 6 are sectional views of a semiconductor structure at various fabrication stages constructed in accordance with some embodiments.
Figure 2B:
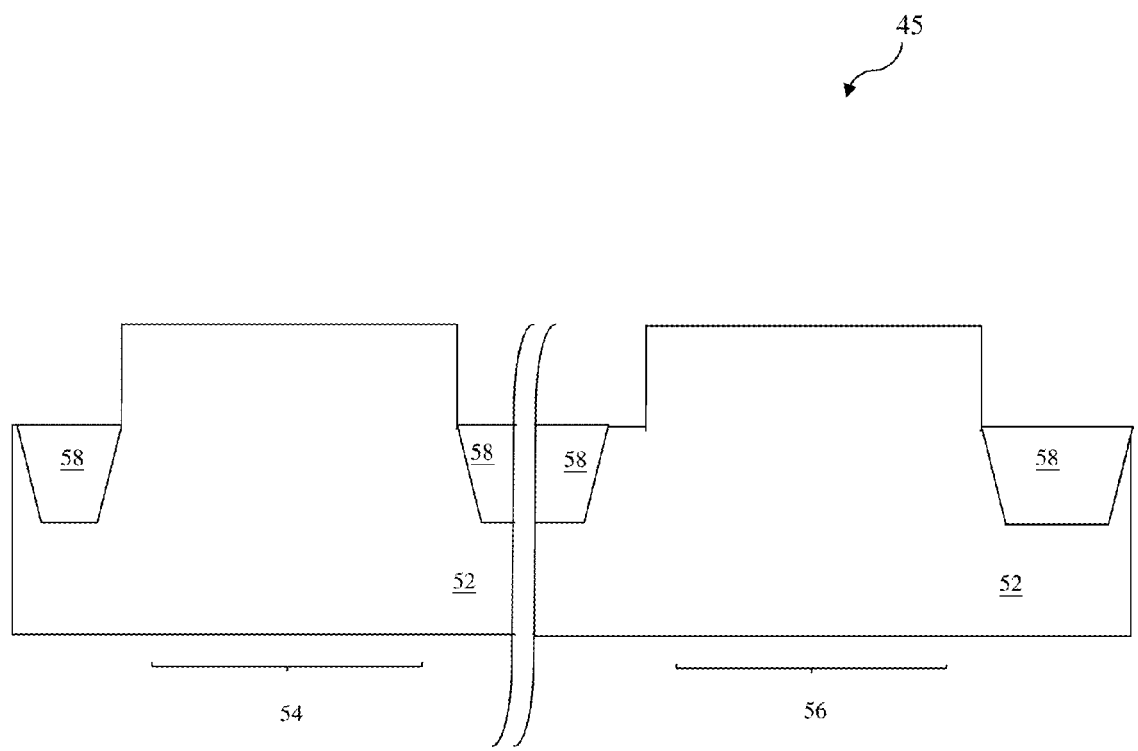
FIG. 2B is a sectional view of a semiconductor structure at a fabrication stage constructed in accordance with some other embodiments.

The method 20 begins at 22 by providing a semiconductor substrate 52, as illustrated in FIG. 2A. The semiconductor substrate 52 includes silicon. Alternatively, the substrate 52 includes germanium or silicon germanium. In other embodiments, the substrate 210 may use another semiconductor material such as diamond, silicon carbide, gallium arsenic, GaAsP, AlInAs, AlGaAs, GaInP, or other proper combination thereof.

The semiconductor substrate 52 includes a first active region (or first region) 54 for one or more n-type field-effect transistor (FET) and a second active region (or second region) 56 for one or more p-type FET. The first active region 54 and the second active region may be separated from each other by various isolation features, such as shallow trench isolation (STI) features 58, formed in the semiconductor substrate 52. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

In some embodiments, the top surface of the semiconductor substrate 52 and the top surfaces of the STI features 58 are substantially coplanar, resulting in a common top surface. This is referred to as a planar structure. In other embodiments, the top surface of the semiconductor substrate 52 and the top surfaces of the STI features 58 are not coplanar, resulting in a three-dimensional structure, such as a fin structure 45 illustrated in FIG. 2B. In a 3D structure having FinFET devices, the active regions (54 and 56) are extended above the top surface of the STI features 58. The fin structure 45 may be formed by various techniques. In some embodiments, the fin structure 45 is formed by recessing the STI features 58, such as by selective etching. In some other embodiments, the fin structure 45 is formed by selective epitaxy growth (SEG). In the SEG process, the fin active region 54 (or 56) is formed with a semiconductor material same to that of the substrate 52 (such as silicon) or different (such as silicon germanium or silicon carbide) to further achieve other functions (e.g., straining effect). The most figures below are still use planar structure for simplicity. However, it is not limited to the planar structure.

Still referring to FIG. 2A, the semiconductor substrate 52 also includes various doped features, such as n-well and p-wells formed by a proper technique, such as ion implantation. In some embodiments, the first active region 54 includes a p-type well 60 doped by a p-type dopant, such as boron, aluminum or gallium; and the second active region 56 includes an n-type well 62 doped by an n-type dopant, such as phosphorous or arsenic. In some embodiments, the first active region 54 is designed to form one or more p-type FET (pFET); and the second active region 56 is designed to form one or more n-type FET (nFET). A p-type (or n-type) dopant may be introduced to the corresponding doped well 54 (or 56) through an opening of a mask layer by a suitable doping process, such as one or more ion implantation. The STI features 58 further functions to define the dopants to the desired active regions. In the present embodiment, both nFETs and pFETs are formed the substrate 52, such as in complimentary metal-oxide-semiconductor (CMOS) circuits.

Figure 3:
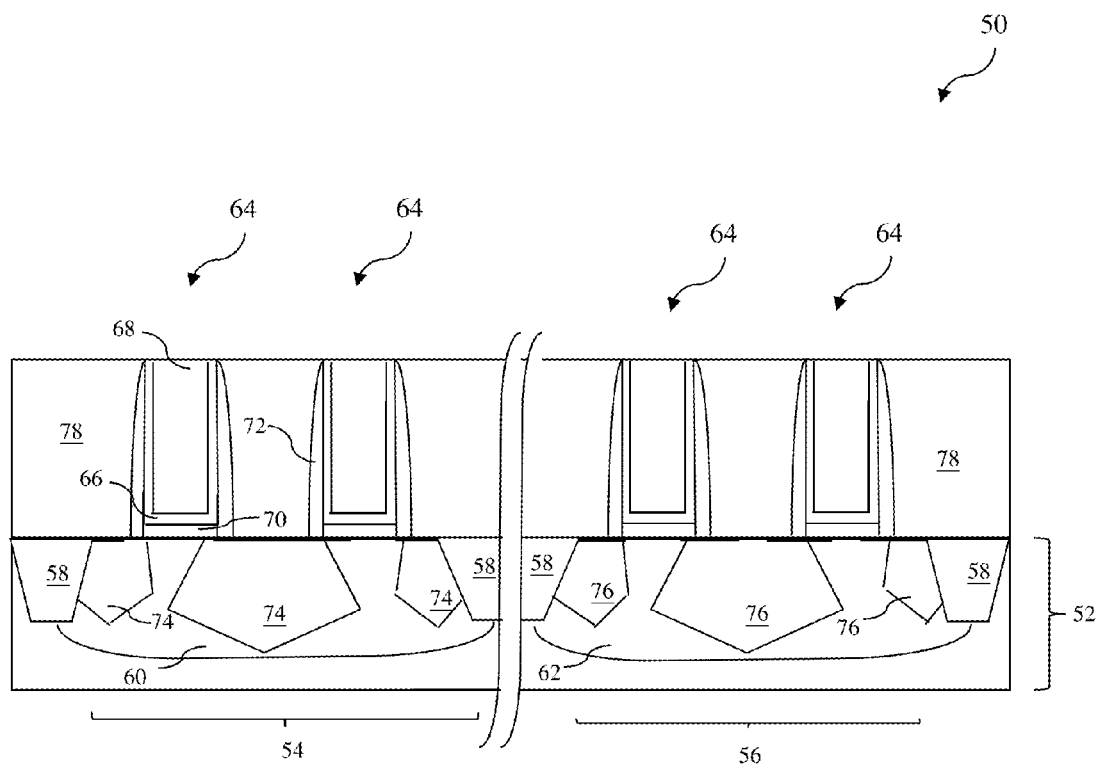

Referring to FIG. 3, the method 20 proceeds to an operation 24 by forming one or more gate stacks 64 on the semiconductor substrate 52. The gate stack 64 includes a gate dielectric layer 66 and a gate conductive layer 68. The formation of the gate stack 64 includes deposition and patterning. The patterning further includes lithography process and etching. A hard mask layer may be further used to pattern the gate stack 64. In some embodiments, the gate dielectric layer 66 includes a high k dielectric material layer formed on the semiconductor substrate 52. In some embodiments, the gate electrode 68 includes a metal, polysilicon or other suitable conductive material or a combination thereof. The gate stack 64 may further include an interfacial layer (IL) 70 interposed between the semiconductor substrate 52 and the high k dielectric material layer 68. In some embodiments, the gate stack 64 further includes gate spacer 72 of one or more dielectric material formed on the sidewalls of the gate stack 64. In various embodiments, the gate stack 64 may be formed in a gate-first process, a gate-last process or a high-k last process. For example in the high-k last process, a dummy gate is formed and a new gate stack with metal gate electrode and high-k dielectric layer is formed to replace the dummy gate at a later fabrication stage. It is also noted that the gate stack in the first active region 54 and the gate stack in the second active region 56 may be formed differently in term of composition and configuration for matching the work functions and enhanced device performance.

Still referring to FIG. 3, the method 20 includes an operation 26 to form source and drain features (or source/drain features or S/D features) in the semiconductor substrate 52. In the operation 26, the S/D features are formed on the substrate and interposed by the corresponding gate stack 64.

In some examples, the source and drain features include doping species introduced by a proper technique, such as epitaxy growth with in-situ doping, or epitaxy growth plus ion implantation. Particularly, first S/D features 74 are formed in the first active region 54 and first S/D features 76 are formed in the second active region 56. The first S/D features 74 include a first semiconductor material doped with an n-type dopant, such as phosphorous or arsenic. The second S/D features 76 include a second semiconductor material doped with a p-type dopant, such as boron. The second semiconductor material is different from the first material in composition. In some embodiments, the first semiconductor material is silicon or silicon carbide. In some embodiments, the second semiconductor material is silicon germanium or silicon. At least one of the first semiconductor material and the second semiconductor material is different from the semiconductor material of the semiconductor substrate 52. Those S/D features are designed to generate strain effect and thereby enhance carrier mobility to the nFET channel and pFET channel, respectively. The formation of the source and drain includes a proper fabrication procedure. In some embodiments, the formation of the first S/D features 74 includes etching to recess the semiconductor substrate within the source and drain areas; and epitaxy growing the first semiconductor material with in-situ dopant, wherein the gas for epitaxy growth includes the first semiconductor material-containing chemical and an n-type dopant-containing chemical. The formation of the second S/D features 76 is a similar procedure but with respective chemicals for the second semiconductor material and p-type dopant. In some embodiment, the S/D features may include light doped drain (LDD) features and heavily doped source/drain, collectively referred to as S/D features. The heavily doped source/drain may be formed by respective ion implantation. One or more thermal annealing process is followed to activate the doped species. The formation of the S/D features may include additional operations or alternatives according to different embodiments, which will be further described at a later stage.

Still referring to FIG. 3, the method 20 proceeds to an operation 28 to form an interlayer dielectric (ILD) material 78 on the substrate 52 and the gate stack 64. The ILD 78 is deposited by a proper technique, such as CVD. The ILD 78 includes a dielectric material, such as silicon oxide, low k dielectric material or a combination. Then a chemical mechanical polishing (CMP) process may be applied thereafter to planarize the surface of the ILD 78. In one example, the gate stack is exposed by the CMP process for the subsequent processing steps. In another example that the hard mask to pattern the gate stack 64 is not removed at the previous operation, the CMP removes the hard mask as well. Alternatively the CMP stops on the hard mask and the hard mask is removed thereafter by an etch process.

Still referring to FIG. 3, the method 20 may further includes an operation 30 by replacing the gate stack 64 with respective metal gate. In this case, the gate stacks 64 are dummy gates. The operation 30 includes partially or completely removing the dummy gates, resulting in gate trenches; filling in the gate trenches with one or more metal; and polishing to remove excessive metal using CMP or other suitable polishing technique. In the operation 30, the removing the dummy gate includes one or more etching steps to selectively remove the gate conductive layer 68 or alternatively the gate stack 64 by a suitable etching process, such as one or more wet etch, dry etch or a combination. In the operation 30, the various gate material layers are filled in the gate trenches by deposition, such as CVD, PVD, plating, ALD or other suitable techniques. In some embodiments such as in high-k last process, the gate material layers include a gate dielectric layer and a gate conductive layer (or gate electrode). The gate dielectric layer includes a high-k dielectric material. The gate conductive layer includes metal. In some embodiments, the gate conductive layer include multiple layers, such as a capping layer, a work function metal layer, a blocking layer and a filling metal layer (such as aluminum or tungsten). The gate material layers may further include an interfacial layer, such as silicon oxide, interposed between the substrate 52 and the high-k dielectric material. The interfacial layer is a portion of the gate dielectric layer. After the gate replacement, the gate stacks are different from the dummy gate stacks in composition.

Figure 4:
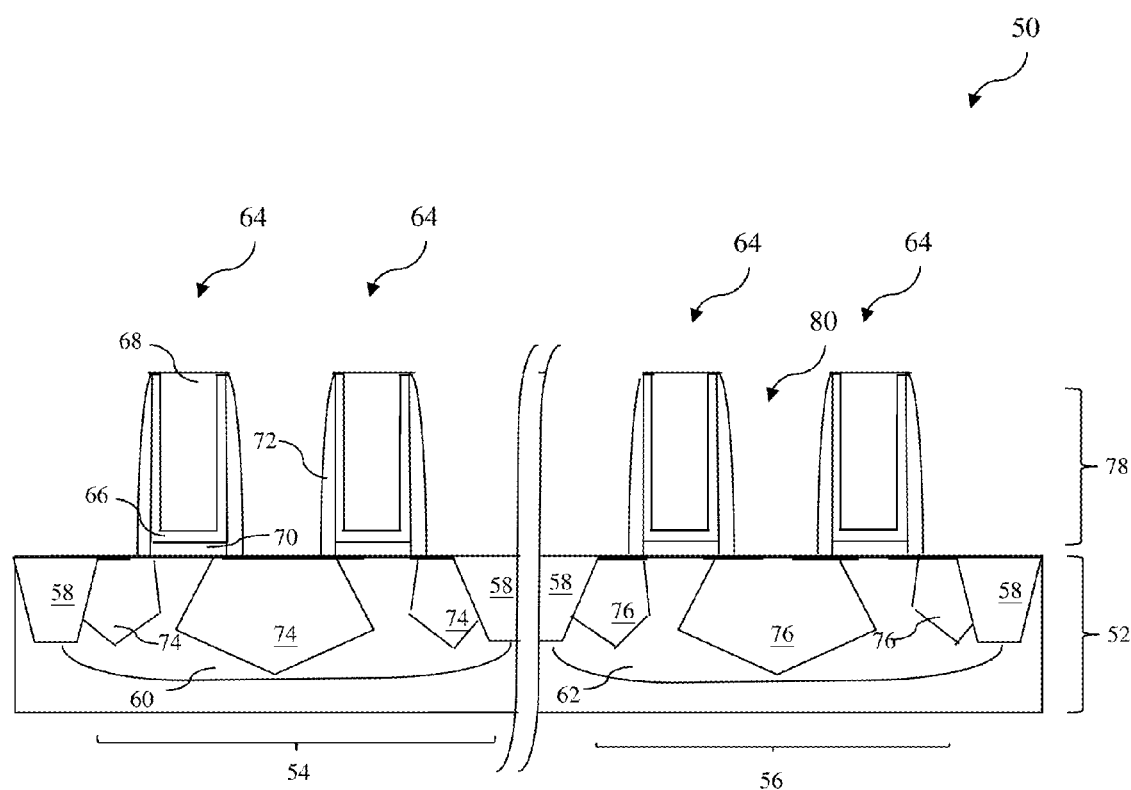

Referring to FIG. 4, the method proceeds to an operation 32 to form contact holes 80 in the ILD 78. The formation of the contact holes 80 includes etching the ILD material 78 such that the S/D features 74 and 76 are exposed within the contact holes 80. The contact holes 80 are configured to be aligned to the S/D features 74 and 76. The etching process may include one or more etch steps, such as wet etch or dry etch or a combination thereof, designed to selectively etch the ILD material. In some embodiments, a mask is formed on the ILD material 78 and includes openings that define the areas for contact holes. The mask may be a hard mask (such as a dielectric material. For example silicon oxide or silicon nitride) or a soft mask (such as photoresist) is formed by a photolithography process. Thereafter, the etching process is applied to the ILD material using the mask as an etch mask. In some other embodiments, the contact holes 80 are formed by a self-aligned contact (SAC) process. In the SAC process, the etching process is applied to the ILD material using the gate as hard mask so that the contact holes are self-aligned the S/D features. In furtherance of the embodiments, the gate stacks (or gate hard mask used to form the gate if present) and the gate spacers are collectively used as an etch mask. In this case, the ILD material is different from the materials of the gate spacer and the gate hard mask so that to provide etch selectivity. The contact holes formed by the SAC process are defined between the adjacent gate stacks and span from the gate spacer to gate spacer. In some other embodiments, a hard mask is combined with SAC process. Specifically, the hard mask is formed by lithography process to define the locations of the contact holes along a first direction parallel to the gate stacks. The gate stacks and gate spacers additionally function as the etch mask to define the contact holes along a direction perpendicular to the first direction.

Figure 5:
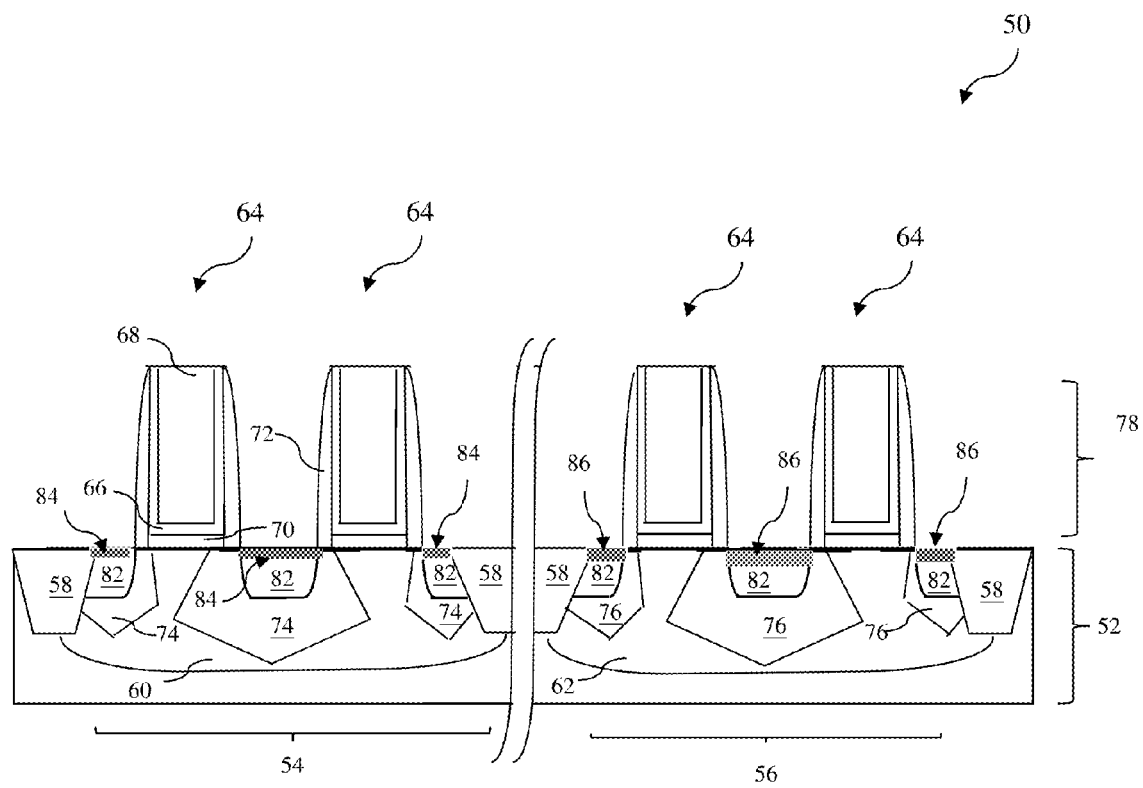

Referring to FIG. 5, the method 20 may proceed to an operation 34 to perform an ion pre-amorphorized implantation (PAI) process to the S/D features (74 and 76) using a first species, thereby generating amorphous regions 82 for better silicide formation. The PAI process is applied to the semiconductor substrate 52 using the gate stack 64, the ILD material and STI features 58 collectively function as an implantation mask so that the amorphous regions 82 are created to be aligned and formed in the S/D features 74 and 76. In some embodiments, the PAI process includes an ion implantation process using the first species selected from silicon, germanium or a combination thereof. The first species is chosen without changing the conductivity of the doped region. The PAI process is designed with various conditions tuned to effectively convert the implanted regions to amorphous regions. In an alternative embodiment, the PAI process is only applied to the second region 56. For example, a mask (a hard mask, such as a dielectric layer; or a soft mask, such as a photoresist layer) is formed on the semiconductor structure 50 and is patterned so that the first region 54 is covered thereby and the second region 56 is exposed within an opening of the mask, then PAI process is applied through the opening of the mask such that the amorphous region is formed in the second region 56 but not in the first region 54.

Still referring to FIG. 5, the method 20 proceeds to an operation 36 by performing an ion implantation process to introduce a second species to both the first S/D features 74 and the second S/D features 76. The operation 36 is designed to reduce the contact resistance to both first and second S/D features. In the present embodiments, the ion implantation process in the operation 36 is applied simultaneously to both the first S/D features 74 in the first region 54 and second S/D features 76 in the second region 56 without further patterning. The contact resistances to both the first and second S/D features can be effectively reduced due to the characteristics of the second species. The second species includes a metal with a suitable electronegativity. The second species is also referred to as the metal species, compared with the first species of a semiconductor material in the PAI process. In some embodiments, the second species is Ytterbium (Yb). In other embodiments, the second species is another metal, such as Erbium (Er), Yttrium (Y), Platinum (Pt), or Barium (Ba).

Due to the dipole effect of Yb and different semiconductor materials in the first and second S/D features, Yb diffuses differently in the first and second S/D features. Especially, Yb diffuses into the second S/D features faster than the first S/D features. Especially, through the process of the method 20, Yb eventually distributes at different height levels in the first and second regions, which will be clear at later stages.

The Yb ion implantation process includes introducing Yb or Yb-containing gas, generating Yb ions and applying Yb ions to the S/D features. If the dosage of Yb is too higher, it will damage the channels and S/D features, causing various issues such as threshold voltage shifting and Drain-induced barrier lowering (DIBL) degradation. If the dosage of Yb is too lower, it will not effectively change the contact resistances. The ion implantation process is designed with above considerations. In the present example, the Yb ion implantation is designed to have an energy ranging between 0.5 keV and 2.5 keV and a dose ranging between $5 \times 10^{13}$ $cm^{-2}$ and $10^{15}$ $cm^{-2}$. In other embodiments, the second species is alternatively Erbium (Er), Yttrium (Y), Selenium (Se), Platinum (Pt), Barium (Ba) or a combination thereof.

In some embodiments, the operation 36 further includes an annealing process designed to diffuse the second species; reduce the defects introduced in the operations 34 and 36; and activate the S/D features. In some embodiment, the annealing process is a millisecond annealing (MSA) process for reduced side effects from the thermal annealing. In some embodiments, the annealing process includes an annealing temperature ranging between 500° C. and 1000° C. After the annealing process, the second species is redistributed in the first and second regions.

Figure 6:
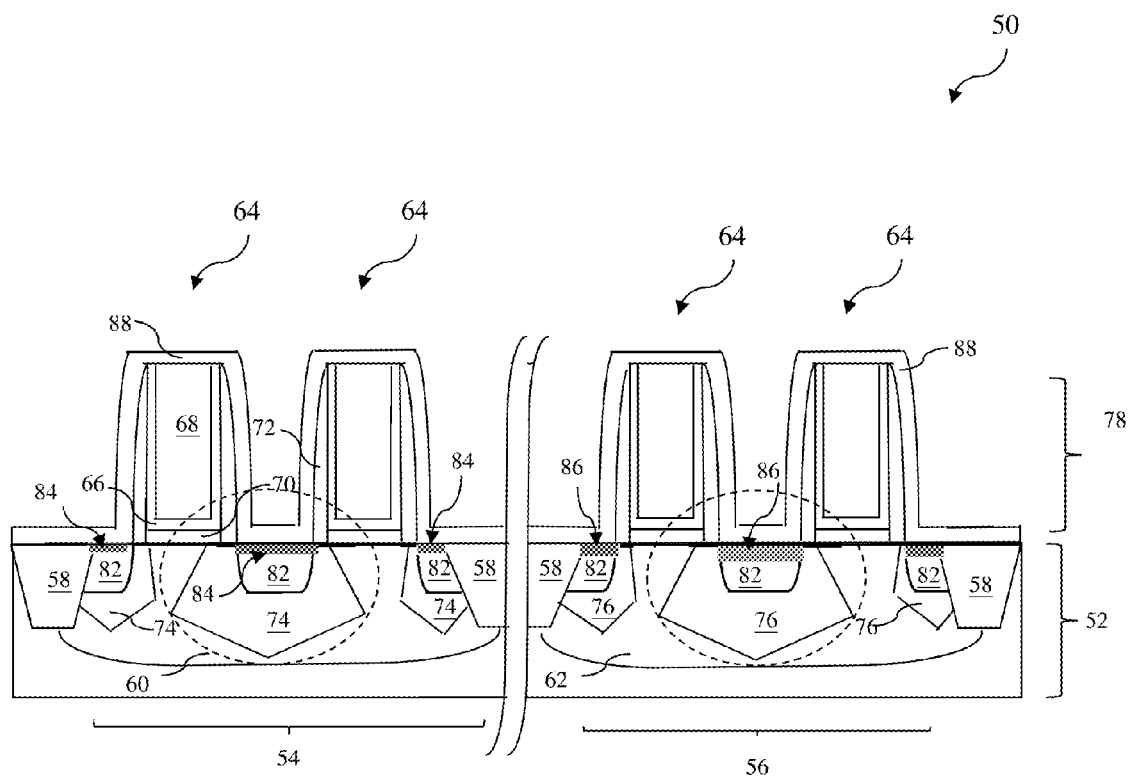

Referring to FIG. 6, the method 20 proceeds to an operation 38 by forming silicide features on the S/D features 74 and 76. Silicide features may be further formed on the source and drain regions to reduce the contact resistance. In some embodiments, the silicide features may be formed by a technique referred to as self-aligned silicide (salicide), which includes metal deposition (such as titanium, tantalum or nickel deposition) onto a silicon substrate, and a thermal anneal to react the metal with silicon to form silicide, and may further includes an etch to removed un-reacted metal.

Figure 7:
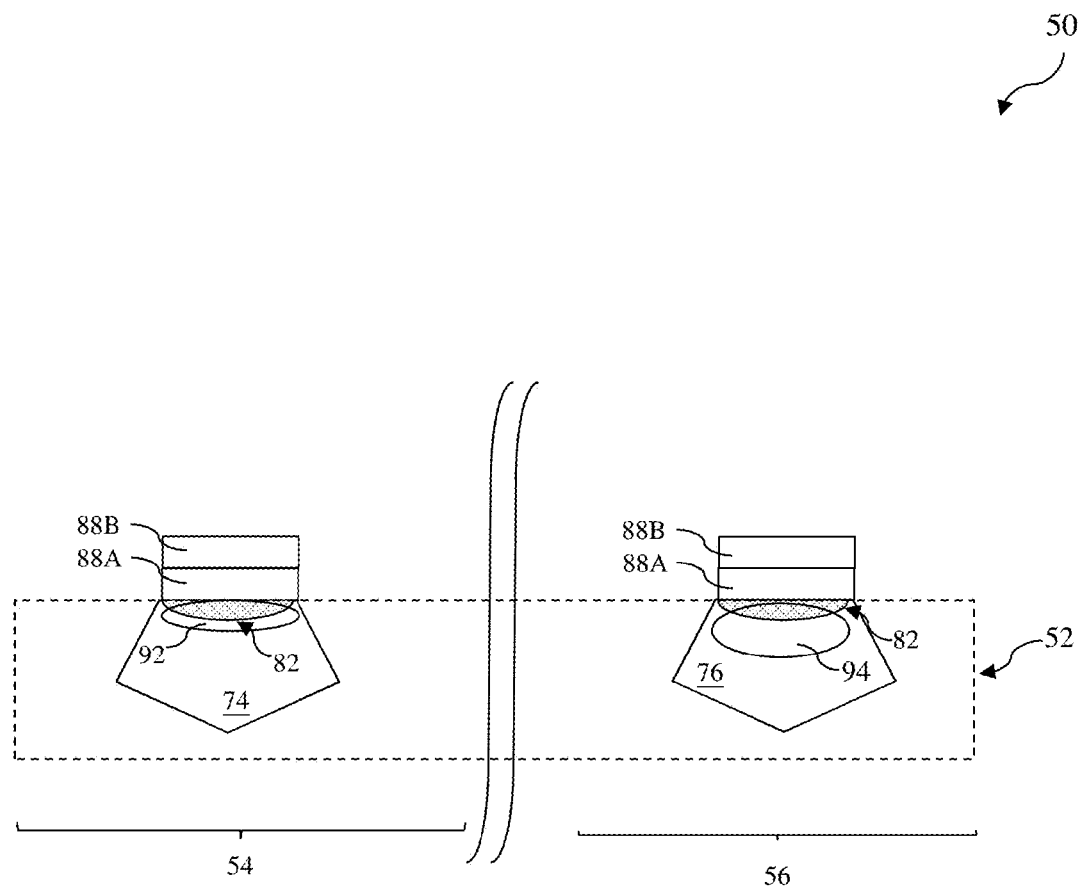
FIGS. 7 and 8 are sectional views of the semiconductor structure of FIG. 6, in portion, constructed in accordance with some embodiments.
Figure 8:
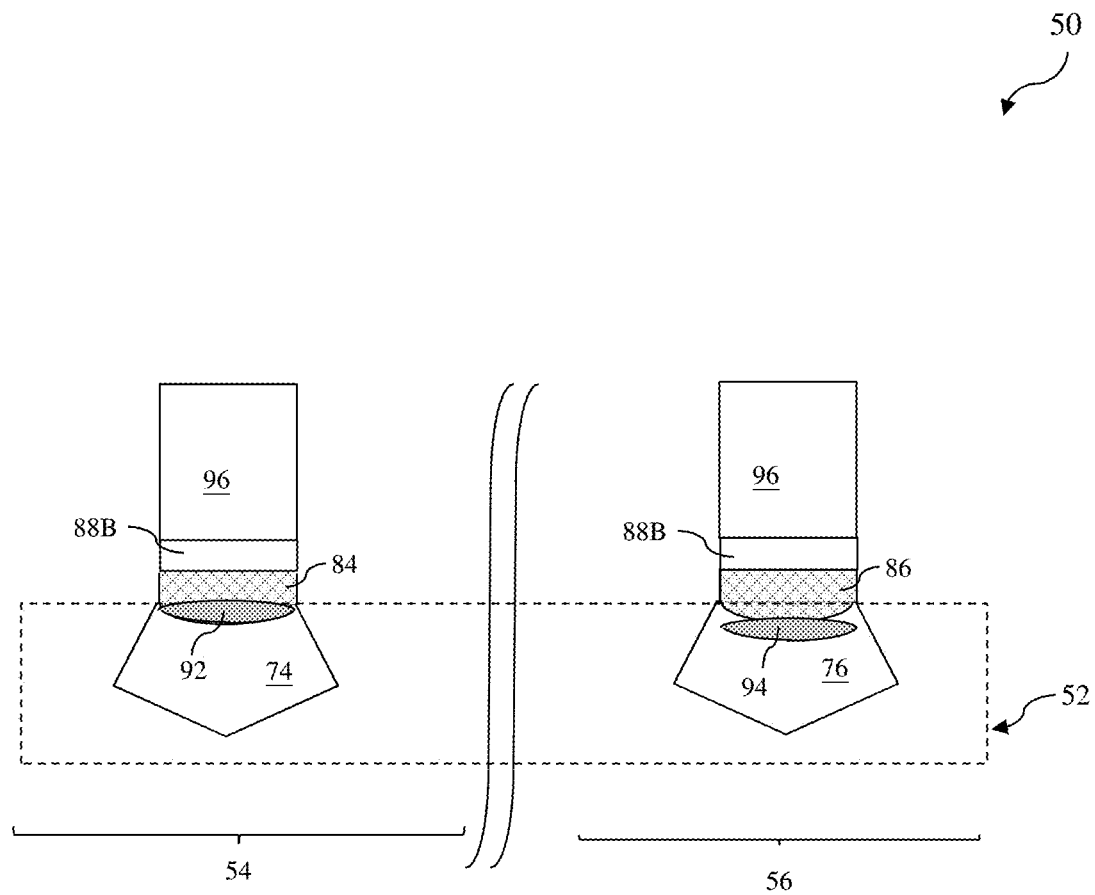

In the present example, the deposited metal layer 88 includes two films: a titanium (Ti) film 88A and a titanium nitride (TiN) film 88B on the Ti film, as illustrated in FIG. 7. For better illustration, only portions (in the dashed circles) of the semiconductor structure 50 in FIG. 6 are shown in FIG. 7. After the metal deposition (Ti and TiN in the present embodiment), an annealing process is applied to react the metal with silicon of the S/D features, thereby forming the first silicide feature 84 and the second silicide feature 86, as illustrated in FIG. 8. In the present example, Ti silicide (TiSi) features are formed on the first and second S/D features. In the embodiments when the PAI implemented, the amorphous regions 82 enhance the formation of the silicide features. The amorphous regions 82 may be completely consumed to form the silicide features in the present embodiment. Particularly, the amorphous regions 82 are therefore substantially converted into the silicide features 84 and 86, respectively. The first silicide feature 84 formed in the first region 54 is from the first semiconductor material (such as silicon carbide or silicon) in the first S/D features 74 and the second silicide feature 86 formed in the second region 56 is from the second semiconductor material (such as silicon germanium) in the first S/D features 76. Alternatively, the silicide features may be formed from other metal, such as tantalum. Nickel or cobalt.

However, as noted above, the diffusion behaviors of the second species (such as Yb) in the first region 54 and the second region 56 are different due to the characteristics of the second species (such as the dipole effect) and further due to the difference of the first and second semiconductor materials in composition. The second species diffuses faster in the second semiconductor material than in the first semiconductor material. Therefore, the second species distributes differently in the first region 54 and the second region 56. The portions containing the second species (such as Yb) are referred to as the metal species-containing (MSC) features, which are labeled as 92 in the first active region 54 and 94 in the second active region 56, respectively, as illustrated in FIG. 7. Since the second species Yb diffuses slower in the first semiconductor material than it does in the second semiconductor material, the first MSC feature 92 in the first active region and the second MSC feature 94 in the second active region 56 are at different height levels. The second MSC feature 94 is higher than the first MSC feature 92. State differently, the first MSC feature 92 is more away from the semiconductor substrate 52 than the second MSC feature 94; and the first MSC feature 92 is substantially distributed in the amorphous region 82 in the first region 54. Thus, after the amorphous regions 82 are converted into the silicide features in the first region 54 and the second region 56, respectively, the second species is substantially distributed in the first silicide feature 84 in the first active region 54 and is substantially distributed in the second S/D feature 76 in the second active region 56. The first MSC feature 92 is substantially formed in the first silicide feature 84 within the first active region 54 and the second MSC feature 94 is substantially formed in the second S/D feature 76 within the first active region 56. The distribution of the second species (such as Yb) in the silicide in the first active region 54 and the Yb in the second S/D features 76 will reduce contact resistances in both regions. Thus, without patterning, by implementing one metal ion implantation process using the second species (such as Yb), both contact resistances to the first S/D feature 74 for the nFET and the second S/D feature 76 for the pFET are reduced with enhanced device performances in both regions. In the above descriptions, the term "substantially distributed in" a region (or a feature) means that the concentration peak of the metal species is located in that region (or the feature). In some embodiments, the term "substantially distributed in" means that the more than 70% of the second species in that region. In some embodiments, the above descriptions, the term "substantially distributed in" means that the more than 90% of the second species in that region. The sentence "the second MSC feature 94 is higher than the first MSC feature 92" means that the concentration center of the second MSC feature 94 is higher than the concentration center of the first MSC 92. The concentration center of a MSC feature is the mass center of the metal species in the corresponding MSC feature.

Referring to back to FIG. 1, the method 20 may further include other operations 40 implemented before, during and after various operations described above. For example, the method 20 may include forming contact features in the contact holes 96 by deposition using one or more conductive materials, such as tungsten, aluminum or other suitable conductive material, as illustrated in FIG. 8. The formation of the contact features may further includes applying a CMP process to remove excessive the conductive material deposited on the ILD layer 78. In another example, the method 20 further includes forming other portions of the interconnection structure. The interconnection structure includes various conductive features (such as metal lines and vias) configured to couple various devices (such as an nFET in the first active region 54 and a pFET in the second active region 56) on the semiconductor substrate 52 into a functional circuit.

Figure 9:
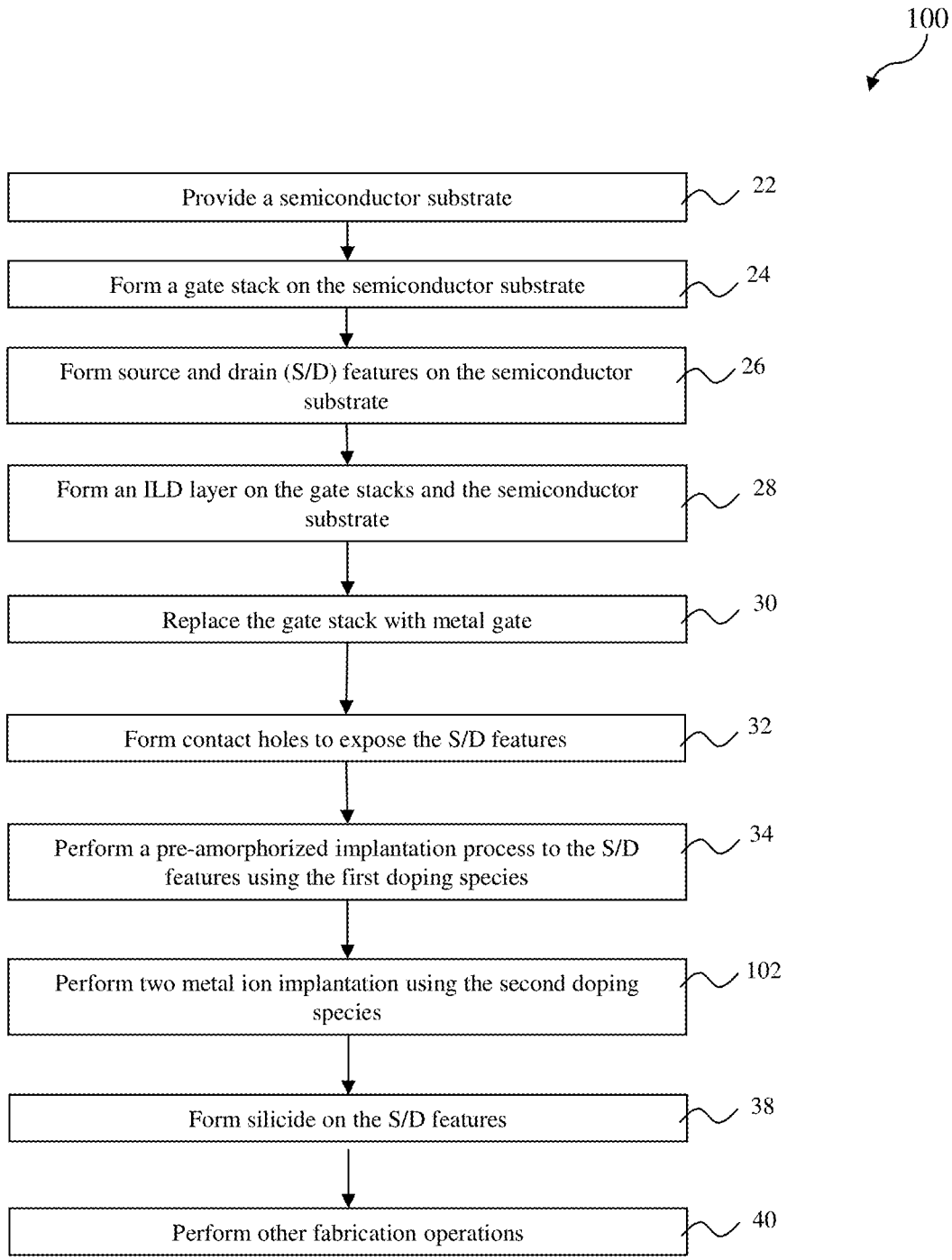
FIG. 9 is a flowchart of a method for making a semiconductor structure constructed in accordance with some embodiments.

FIG. 9 is a flowchart of a method 100 constructed in accordance with some other embodiments. The method 100 has some of the operations similar to those in the method 20 and those operations are not repeated here for simplicity. The method 100 is described below with references to FIGS. 2-9. The method 100 starts at 22 by providing the semiconductor substrate 52 having the first region 54 and the second region 56. The method 100 includes an operation 24 by forming a gate stack 64 on the first region 54 and a gate stack 64 on the second region 56. The method 100 includes an operation 26 by forming the first S/D feature 74 in the first region 54 and the S/D feature 76 in the second region 56. The method 100 includes an operation 28 by forming the ILD layer 78 and may include the operation 30 by replace the gate stacks with respective gates with high k dielectric material and metal. Such formed gate stacks may be formed in different procedure, such as a gate-last process or a high-k last process. Thus formed gate stacks in the first and second regions may be different in terms of composition and configured for matching work functions and enhanced device performance. The method 100 also includes the operation 32 by forming the contact holes in the ILD layer. In some example, the contact holes are formed by a SAC process. The method 100 may further include the operation 34 by performing a PAI process using the first species, such as silicon, germanium or a combination thereof.

The method 100 includes an operation 102 by performing a metal ion implantation process to the first region 54 and the second region 56, respectively, using the second species, such as Yb, Er, Y, Se, or Pt. The operation 102 is different from the operation 36. The metal ion implantation process in the operation 102 includes a first metal on implantation applied to the first active region 54 and a second metal ion implantation applied to the second active region 56, respectively. In a particular example, the first metal ion implantation is applied to both the first active region 54 and the second active region 56; then a mask (hard mask or soft mask) is formed on the semiconductor structure covering the first active region 54 while the second active region 56 is exposed within the opening of the mask; and then the second metal ion implantation is applied to the second active region 56 only using the mask as an implantation mask. The second metal ion implantation is designed to have a higher bias power such that the second species (such as Yb) is introduced to a deeper level in the second S/D feature 76. Alternatively or additionally, another mask is formed on the semiconductor structure 20 and is patterned to covering the second active region 76 while the first active region 74 is exposed within the opening of the corresponding mask. The first metal ion implantation is applied to the semiconductor structure 20 using this mask as an implantation mask such that the first metal ion implantation is only applied to the first S/D feature 74 in the first active region 54. The first metal ion implantation is designed to have a lower bias power such that the second species is introduced to a shallower level in the first S/D feature 74. In some embodiments, the first and second metal ion implantations are designed to have different doses for optimized device performance.

After the metal ion implantation process, an annealing process, such as MSA, may be applied to eliminate or reduce the defects in the semiconductor structure 20, such as the defects caused by the ion implantations. The method 100 also proceeds to the operation 38 by forming the silicide features on the S/D features in the first and second active regions and may further include other fabrication operations 40.

Figure 10:
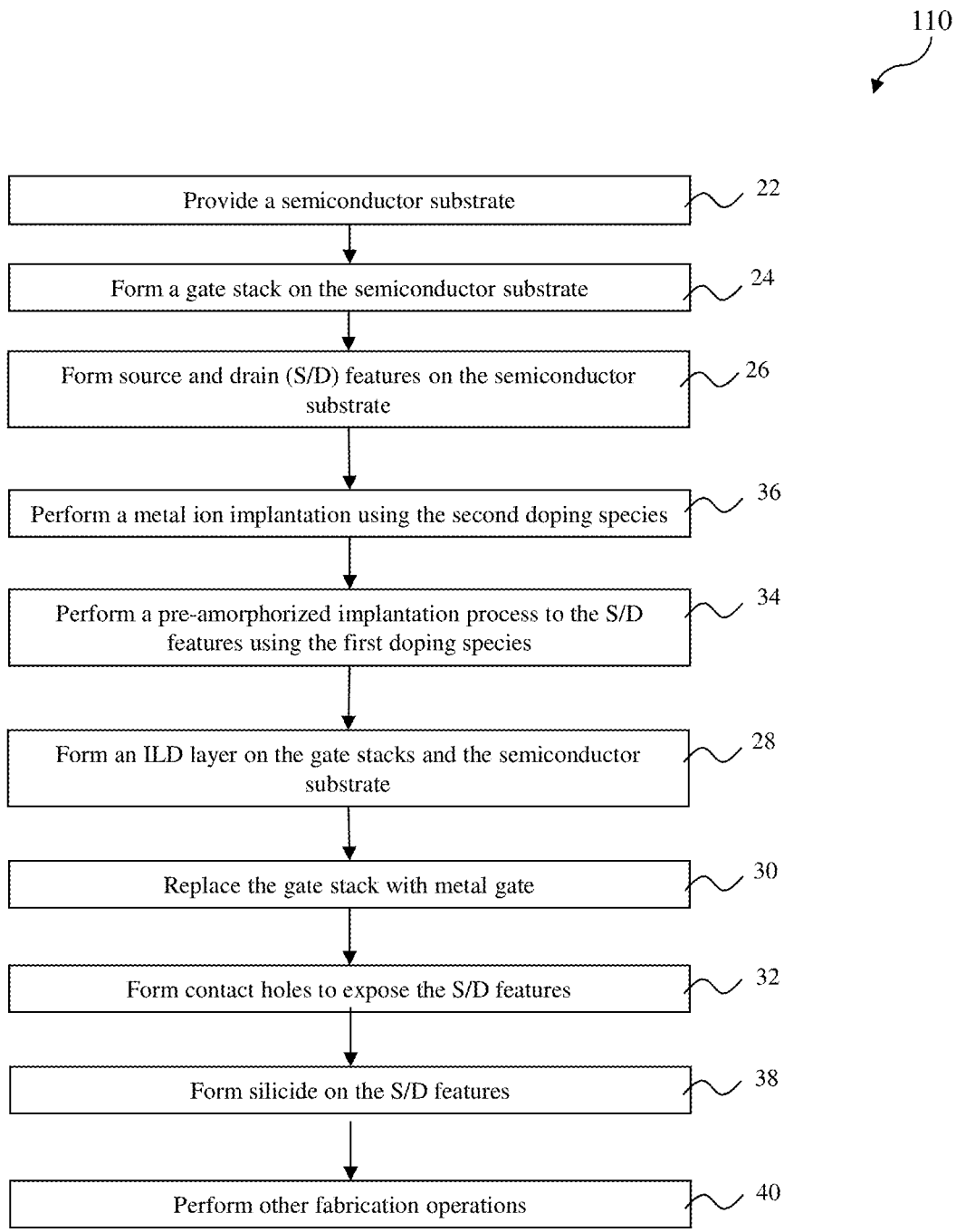
FIG. 10 is a flowchart of a method for making a semiconductor structure constructed in accordance with some embodiments.

FIG. 10 is a flowchart of a method 110 constructed in accordance with some other embodiments. The method 110 has some of the operations similar to those in the method 20 and those operations are not repeated here for simplicity. The method 110 is described below with references to FIGS. 2-8 and 10. The method 110 starts at 22 by providing the semiconductor substrate 52 having the first region 54 and the second region 56. The method 110 includes an operation 24 by forming a gate stack 64 on the first region 54 and a gate stack 64 on the second region 56. The method 110 includes an operation 26 by forming the first S/D feature 74 in the first region 54 and the S/D feature 76 in the second region 56.

Then the method 110 proceeds to the operation 36 by performing a metal ion implantation using the second species. In this case, the metal ions are introduced into the S/D features using the gate stacks 64 and the STI features 58 collectively as the ion implantation mask. The method 110 proceeds to the operation 34 by performing a PAI process using the first species, such as silicon, germanium, or a combination thereof. The method 110 may include an annealing process (such as MSA), applied to eliminate or reduce the defects in the semiconductor structure 20, such as the defects caused by the ion implantations after the operation 36 or after the operations 36 and 34.

Thereafter, the method 110 proceeds to the operation 28 by forming the ILD layer 78. The operation 28 may include deposition and CMP. The method 110 may further include the operation 30 by replace the gate stacks with respective metal gates having high k dielectric material and metal electrode. The method 110 also includes the operation 32 by forming the contact holes 80 in the ILD layer 78. In some example, the contact holes are formed by a SAC process. Then, the method 110 proceeds to the operation 38 by forming the silicide features on the S/D features in the first and second active regions and may further include other fabrication operations 40. In the operation 38, an annealing process is applied to reactive metal with silicon to form silicide. Especially the second species will redistribute due to diffusion, especially during the annealing process. The second species will diffuse faster in the second semiconductor material (such as silicon germanium) than in the first semiconductor material (such as silicon). The second species will substantially distributes in the first silicide feature in the first active region 54 and substantially distributes in the second S/D feature in the second active region 56. In other words, the first MSC feature 92 is higher than the second MSC feature 94 as illustrated in FIG. 8.

Figure 11:
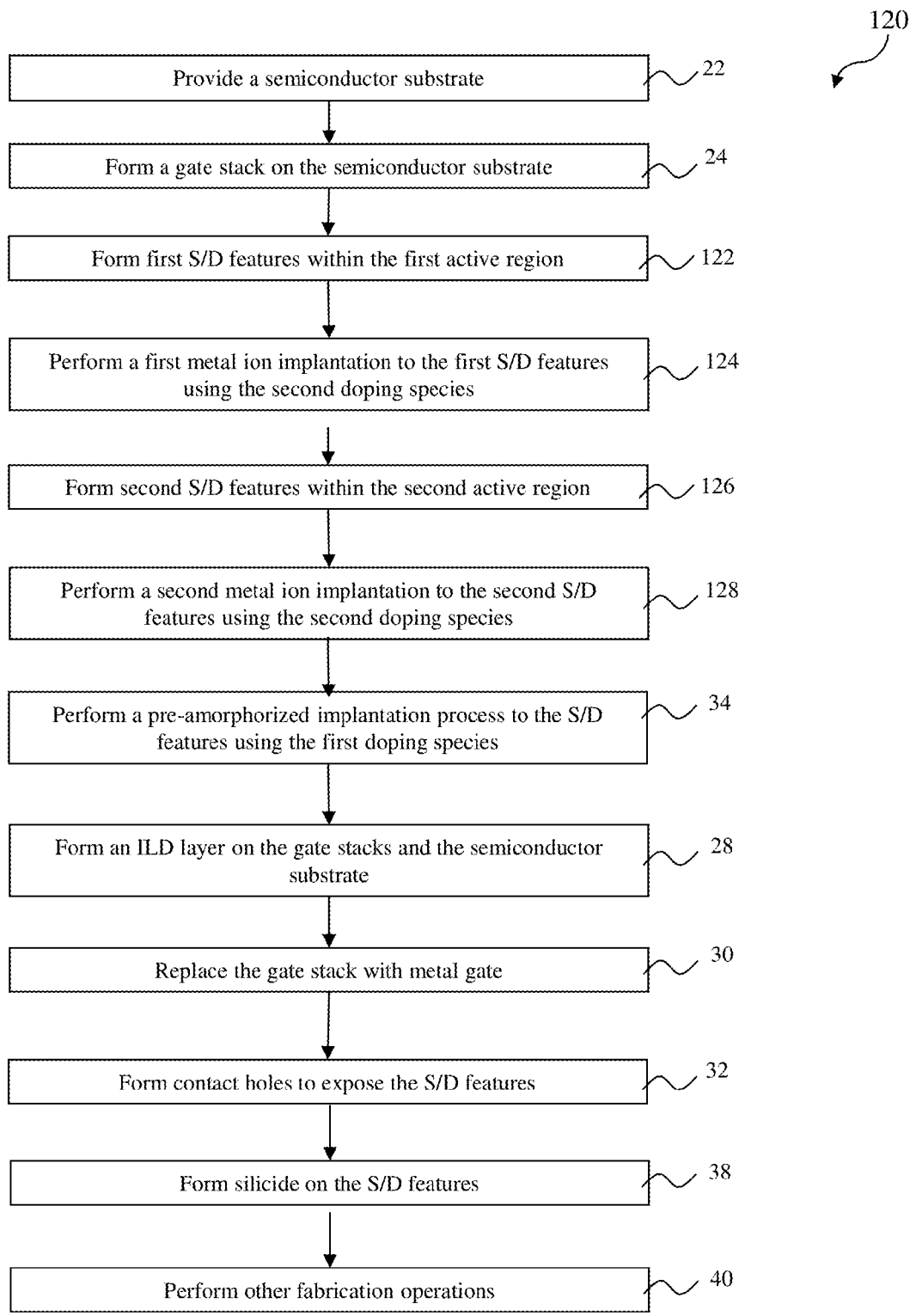
FIG. 11 is a flowchart of a method for making a semiconductor structure constructed in accordance with some embodiments.

FIG. 11 is a flowchart of a method 120 constructed in accordance with some other embodiments. The method 120 has some of the operations similar to those in the method 20 and those operations are not repeated here for simplicity. The method 120 is described below with references to FIGS. 2-8 and 11. The method 120 starts at 22 by providing the semiconductor substrate 52 having the first region 54 and the second region 56. The method 120 includes an operation 24 by forming a gate stack 64 on the first region 54 and a gate stack 64 on the second region 56.

The method 120 includes an operation 122 by forming the first S/D feature 74 in the first region 54. The formation of the first S/D feature 74 is similar to the formation of the first S/D feature 74 in the method 20. For example, when the first semiconductor material in the first S/D feature 74 is different from the semiconductor material in the semiconductor substrate 52, the first S/D feature 74 is formed by a procedure includes etching to recess the semiconductor substrate in the first active region; and epitaxy growing the first semiconductor material (such as silicon carbide) in the recess. The n-type dopant may be in-situ introduced to the first S/D feature during the epitaxy growth.

The method 120 also includes an operation 124 by performing a first metal ion implantation to the first S/D feature 74 using the second species (such as Yb). Since the first metal ion implantation is designed to and only applied to the first S/D feature 74, the implantation depth is controlled by the implantation bias power such that the second species is distributed in the shallower portion of the first S/D feature 74. In some embodiment, a patterned mask is formed on the semiconductor substrate 52 by lithography patterning and etching. The patterned mask covers the second active region 56 and includes an opening to expose the first active region 54 for the first metal ion implantation.

In another embodiment, the second species is introduced to the first S/D feature 74 during the epitaxy growth of the operation 122. In this case, the gas for the epitaxy growth of the operation 122 also includes a chemical containing the second species. So the operations 122 and 124 are combined together. Especially, during the epitaxy growth, the gas includes a first chemical that contains the first semiconductor material; a second chemical that contains an n-type dopant; and a third chemical that contains the second species.

The method 120 includes an operation 126 by forming the second S/D feature 76 in the second region 56. The formation of the second S/D feature 76 is similar to the formation of the second S/D feature 76 in the method 20. For example, when the second semiconductor material in the second S/D feature 76 is different from the semiconductor material of the semiconductor substrate 52, the second S/D feature 76 is formed by a procedure includes etching to recess the semiconductor substrate in the second active region; and epitaxy growing the second semiconductor material (such as silicon germanium) in the recess. The p-type dopant may be in-situ introduced to the second S/D feature 76 during the epitaxy growth. In the present embodiment, the second semiconductor material includes silicon germanium.

The method 120 also includes an operation 128 by performing a second metal ion implantation to the first S/D feature 76 using the second species (such as Yb). Since the second metal ion implantation is designed to and only applied to the second S/D feature 76, the implantation depth is controlled by the implantation bias power such that the second species is distributed in the deeper portion of the second S/D feature 76. In some embodiment, a patterned mask is formed on the semiconductor substrate 52 by lithography patterning and etching. The patterned mask covers the first active region 54 and includes an opening to expose the second active region 56 for the second metal ion implantation.

In some embodiments, the second species is introduced to the second S/D feature 76 during the epitaxy growth of the operation 126. In this case, the gas for the epitaxy growth of the operation 122 also includes a chemical containing the second species. So the operations 126 and 128 are combined together. Especially, during the epitaxy growth, the gas includes a first chemical that contains the second semiconductor material; a second chemical that contains a p-type dopant; and a third chemical that contains the second doping species.

In some embodiments, the second metal ion implantation uses a doping species different from the doping species used in the first metal ion implantation. The doping species in the second metal ion implantation is chosen to properly adjust its work function.

In some other embodiments, the operations 122 through 128 are in a different sequence. For example, the operations 126 and 128 are implemented before the operations 122 and 124. In some embodiments, only one of the 124 and 126 are implemented. For example, only the second S/D feature 76 is epitaxy grown with in-situ doping by the second p-type dopant and the second species (such as Yb).

Then the method 120 proceeds to the operation 34 by performing a PAI process using the first species, such as silicon, germanium, or a combination thereof. The method 120 may include an annealing process (such as MSA), applied to eliminate or reduce the defects in the semiconductor structure 20, such as the defects caused by the ion implantations after the operations 122-128 or after the operation 34.

Thereafter, the method 120 proceeds to the operation 28 by forming the ILD layer 78. The operation 28 may include deposition and CMP. The method 120 may further include the operation 30 by replace the gate stacks with respective metal gates having high k dielectric material and metal electrode. The method 120 also includes the operation 32 by forming the contact holes 80 in the ILD layer 78. In some example, the contact holes are formed by a SAC process. Then, the method 120 proceeds to the operation 38 by forming the silicide features on the S/D features in the first and second active regions and may further include other fabrication operations 40. In the operation 38, an annealing process is applied to reactive metal with silicon to form silicide. Especially the doped species will be directly introduced during the epitaxy growth; or be separately ion implanted to the first and second S/D features, respectively; or even have different doping species to tune the respective work functions in the first and second active regions.

Even though the disclosed method (20, 100, 110 or 120) describes a semiconductor structure 50 having the contact features with reduced contact resistances and the method making the same in accordance with various embodiments, other components (such as gates, and S/D features) of the semiconductor structure 50 may have different configuration and may be formed by other techniques, as described below.

Figure 12:
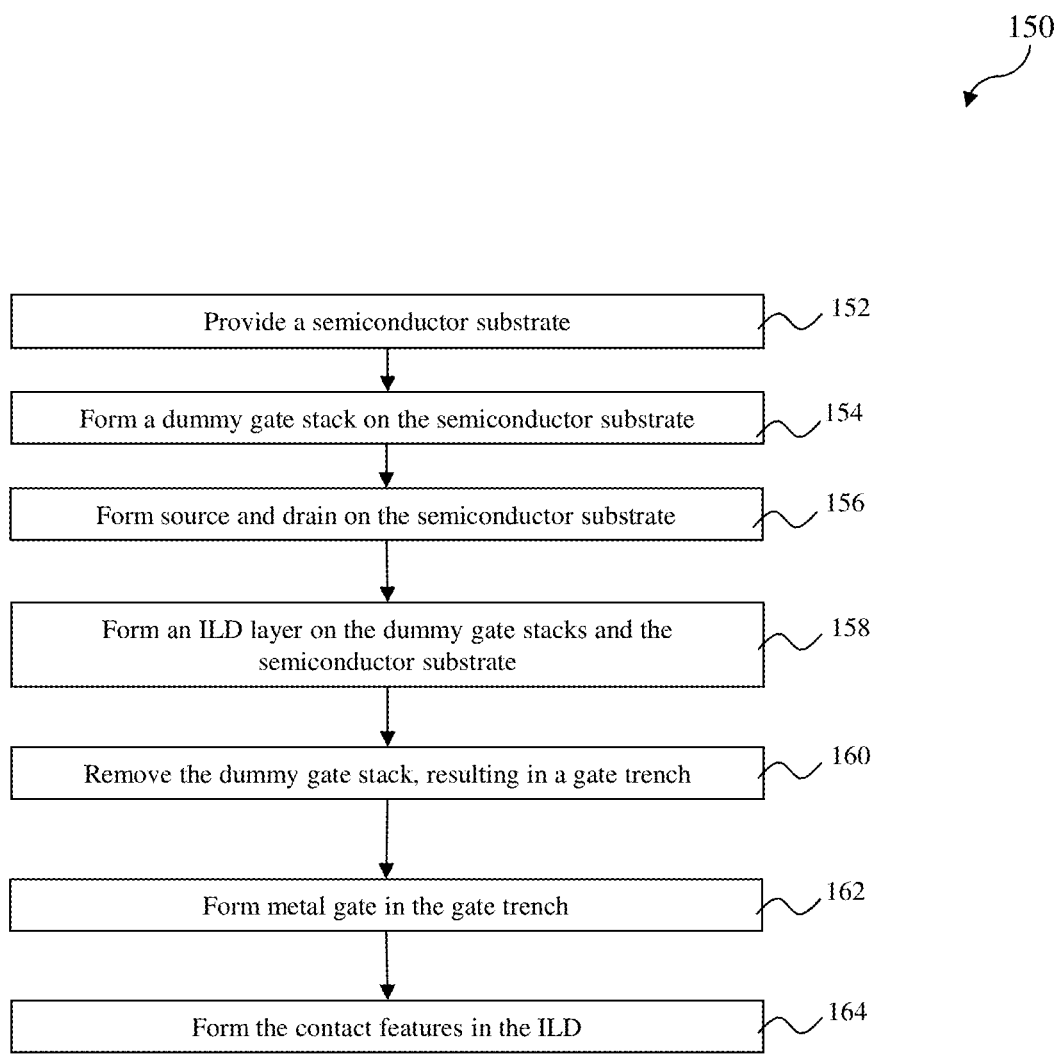
FIG. 12 is a flowchart of a method for making a semiconductor structure constructed in accordance with some embodiments.

FIG. 12 is a flowchart of one embodiment of a method 150 making a semiconductor device constructed in accordance with some embodiments. FIGS. 12-19 are sectional views of a semiconductor structure 200 at various fabrication stages in accordance with some embodiments. The semiconductor structure 200 only illustrates one gate stack. However, it is understood that the semiconductor structure 200 includes the first region for at least one nFET and a second region for at least one pFET. The method 150 includes various approaches (such as those described in methods 20, 100, 110 and 120) to introduce the metal doping species (such as Yb) into the S/D features in nFET and pFET, in order to reduce the contact resistances for both nFET and pFET. Those similar descriptions are not repeated and more details are provided on the formation of other components, such as gate stacks and S/D features, of the semiconductor structure. FIG. 20 is a sectional view of the gate stack in the semiconductor structure 200 in accordance with some embodiments. The semiconductor structure 200 and the method 150 of making the same are collectively described with reference to FIGS. 12 through 20.

Figure 13:
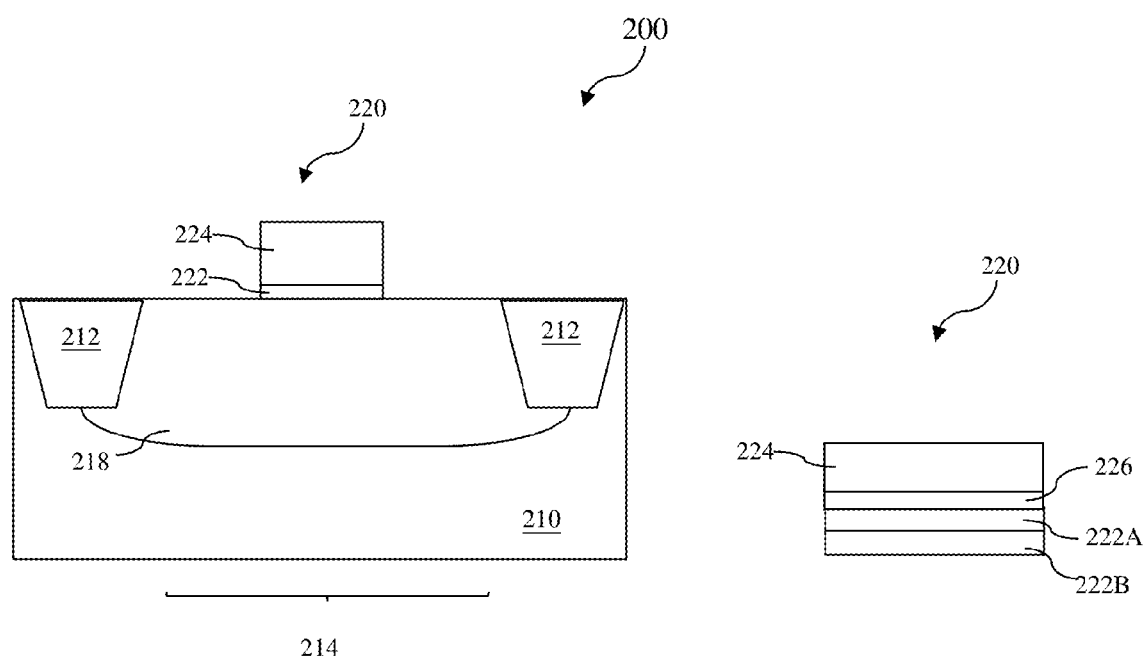
FIGS. 13, 14, 15, 16, 17, 18 and 19 are sectional views of a semiconductor structure at various fabrication stages constructed in accordance with some embodiments.

Referring to FIG. 13, the method 150 begins at 152 by providing a semiconductor substrate 210. The semiconductor substrate 210 includes silicon. Alternatively, the substrate 210 includes germanium or silicon germanium. In other embodiments, the substrate 210 may use another semiconductor material such as diamond, silicon carbide, gallium arsenic, GaAsP, AlInAs, AlGaAs, GaInP, or other proper combination thereof.

The semiconductor substrate also includes various doped regions such as n-well and p-wells formed by a proper technique, such as ion implantation. The semiconductor substrate 210 also includes various isolation features, such as shallow trench isolation (STI) features 212, formed in the substrate to define active regions 214 and separate various devices on the active regions. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

Figure 14:
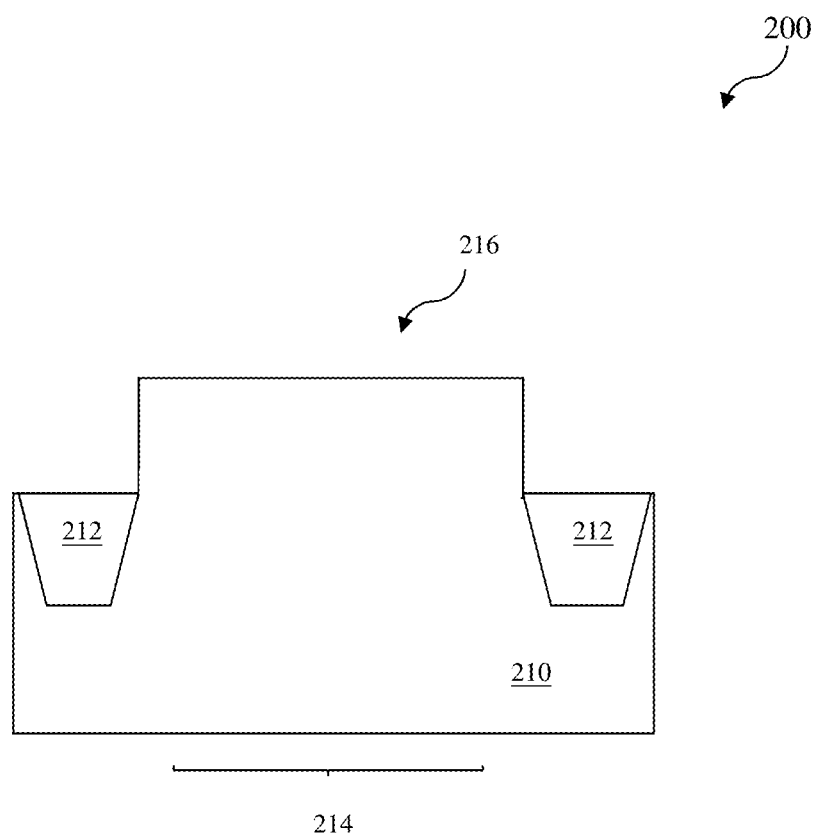

In some embodiments, the top surface of the semiconductor substrate 210 and the top surfaces of the STI features 212 are substantially coplanar, resulting in a common top surface. This is referred to as a planar structure. In other embodiments, the top surface of the semiconductor substrate 210 and the top surfaces of the STI features 212 are not coplanar, resulting in a three-dimensional structure, such as a fin structure 216, as illustrated in FIG. 14. The active region 214 is extended above the top surface of the STI features 212 and therefore is referred to as the fin structure. Thus various devices are formed on the fin structure 216. Particularly, a field effect transistors (FET) is formed on the fin structure 216 and the corresponding gate of the FET is coupled with the channel from the multiple surfaces (top surface and sidewalls) of the fin structure, thus enhancing the device performance. Accordingly, the FET formed on the fin structure 216 is referred to as FinFET. The disclosed structure 200 and the method 100 making the same provide improvements to integrated circuits, especially to the FinFET.

The fin structure 216 may be formed by various techniques. In some embodiments, the fin structure 216 is formed by recessing the STI features 212, such as by selective etching. In some other embodiments, the fin structure 216 is formed by selective epitaxy growth (SEG). In the SEG process, the fin structure 216 is formed with a semiconductor material same to that of the substrate 210 (such as silicon) or different (such as silicon germanium or silicon carbide) to further achieve other functions (e.g., straining effect). The most figures below are still use planar structure for simplicity. However, it is not limited to the planar structure.

Still referring to FIG. 13, a doped well 218 may be formed in one or more active region 214. In some embodiments, the active region 214 is designed to form a FET, such as a p-type FET (pFET) or an n-type FET (nFET). In some examples, a pFET is to be formed on the active region 214, and the doped well 218 includes an n-type dopant, such as phosphorous (P). In some other examples, an nFET is to be formed on the active region 214, and the doped well 218 includes a p-type dopant, such as boron (B), distributed in an active region. The dopant may be introduced to the doped well 218 through an opening of the mask layer by a suitable doping process, such as one or more ion implantation. The STI features 212 further functions to define the dopants to the desired active regions. In some embodiments, both nFETs and pFETs are formed the substrate 210, such as in complimentary metal-oxide-semiconductor (CMOS) circuits.

Still referring to FIG. 13, the method 150 proceeds to an operation 154 by forming one or more dummy gate stack 220 on the semiconductor substrate 210. The gate stack 220 includes a gate dielectric layer 222 and a gate conductive layer 224. The formation of the gate stack 220 includes deposition and patterning. The patterning further includes lithography process and etching. A hard mask layer may be further used to pattern the gate stack 220.

In some embodiments as illustrated on the left of FIG. 13 with more details, the gate dielectric layer 222 includes a high k dielectric material layer 222A formed on the semiconductor substrate 210. A capping layer 226 may be formed on the gate dielectric layer 222. A polysilicon layer as the gate conductive layer is formed on the capping layer 226. The gate dielectric layer 222 may further include an interfacial layer (IL) 222B interposed between the semiconductor substrate 210 and the high k dielectric material layer 222A.

In furtherance of the embodiments, the interfacial layer 222B is formed on the substrate 210 before forming the high k dielectric material layer 222A. The interfacial layer 222B may include silicon oxide formed by a proper technique, such as an atomic layer deposition (ALD), thermal oxidation or UV-Ozone Oxidation. The interfacial layer may have a thickness less than 10 angstrom.

The high-k dielectric layer 222A includes a dielectric material having the dielectric constant higher than that of thermal silicon oxide, about 3.9. The high k dielectric layer 222A is formed by a suitable process such as ALD. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer 222A includes metal nitrides, metal silicates or other metal oxides.

The capping layer 226 is formed on the high k dielectric material layer 222A. In one embodiment, the capping layer 226 includes titanium nitride (TiN). In another example, the thickness of the titanium nitride layer ranges between about 5 angstrom and about 20 angstrom. The capping layer 226 may alternatively or additionally include other suitable materials. The capping layer 226 is formed by a proper technique, such as PVD.

The polysilicon layer 224 is formed on the capping layer 226. The polysilicon layer 224 is formed by a proper technique, such as CVD. In one example, the polysilcion layer 224 is non-doped. In another example, the polysilicon layer 224 has a thickness between about 500 angstrom and about 1000 angstrom.

A patterned mask may be further formed on the multiple gate material layers and is used as a mask to form the gate stack 220. The patterned mask is formed on the polysilicon layer 224. The patterned mask defines various gate regions and various openings exposing the gate stack material layers to be removed. The patterned mask includes a hard mask, such as silicon nitride and/or silicon oxide, or alternatively photoresist. In one embodiment, the patterned mask layer includes a patterned hard mask layer with silicon nitride and silicon oxide. As one example, a silicon nitride layer is deposited on the polysilicon layer by a low pressure chemical vapor deposition (LPCVD) process. The silicon nitride and silicon oxide layers are further patterned using a photolithography process to form a patterned photoresist layer and an etching process to etch the silicon oxide and silicon nitride within the openings of the patterned photoresist layer. Alternatively, other dielectric material may be used as the patterned hard mask. For example, silicon oxynitride may be used as the hard mask. In another embodiment, the patterned mask layer includes a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

The method includes patterning the gate material layers. One or more etching process is applied to the gate material layers through the openings of the patterned mask. The etching process may include dry etching, wet etching or a combination thereof, In other examples, the etching process may include multiple steps to effectively etch various gate material layers.

In some other embodiments, such as in a high-k last process, the high-k dielectric layer is not formed in the dummy gate stack 220. In this case, the gate dielectric layer 222 includes silicon oxide and the gate conductive layer 224 includes polysilicon. The deposition and patterning processes are similar to those described above.

Figure 15:
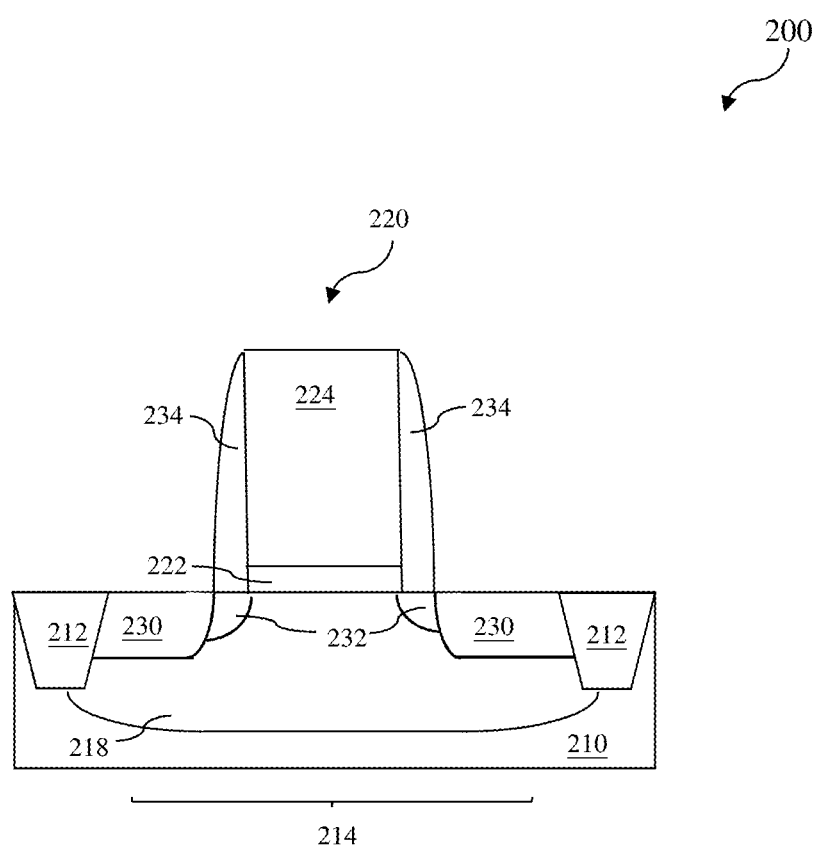

Referring to FIG. 15, the method 150 includes an operation 156 to form source and drain 232 in the substrate 210. In the operation 106, a gate spacer 232 may be formed on the sidewall of the gate stack 220. The source and drain (S/D) 230 are formed on the substrate 210 and interposed by the gate stack 220.

In yet another embodiment, the semiconductor structure 200 may further include light doped drain (LDD) features 232 formed on the substrate 210 with the same type conductivity and a lower doping concentration. The LDD features 232 and S/D 230 are formed respectively ion implantation. One or more thermal annealing process is followed to activate the doped species.

The gate spacer 232 includes one or more dielectric material, such as silicon oxide, silicon nitride, silicon oxynitride or combinations thereof. In one embodiment, the gate spacer 232 includes a seal spacer disposed on the sidewall of the gate stack and a main spacer disposed on the seal spacer, which are formed respectively by a procedure including deposition and etch.

In some examples, the source and drain 230 include doped doping species introduced to the semiconductor substrate 210 by a proper technique, such as ion implantation. In one embodiment, the gate stack 220 is configured in the active region for a n-type field effect transistor (nFET), the dopant of the source and drain is n-type dopant, such as phosphorus or arsenic. In another embodiment, the gate stack is configured in the active region for a p-type field effect transistor (pFET), the dopant of the source and drain is p-type dopant, such as boron or gallium. In yet another embodiment, the source and drain 230 include light doped drain (LDD) features and heavily doped source drain (HDD) features, collectively referred to as source and drain (S/D) features. The LDD features and HDD features are formed respectively ion implantation. One or more thermal annealing process is followed to activate the doped species.

Figure 16:
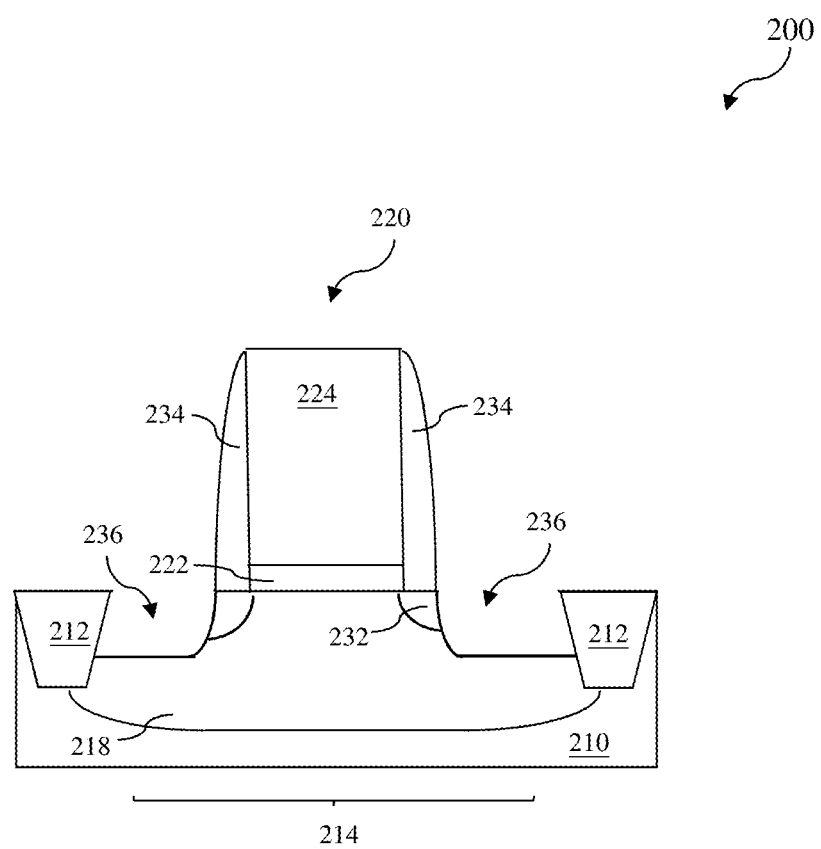

In some embodiments, the S/D features 230 are formed by epitaxy growth to enhance device performance, such as for strain effect to enhance mobility. In furtherance of the embodiments, the formation of the S/D features 230 includes selectively etching the substrate 210 to form the recesses 236 as illustrated in FIG. 16; and eptaxy growing a semiconductor material in the recesses 236 to form the source and drain 230 (such as those illustrated in FIG. 15).

The recesses 236 may be formed using, such as a wet (and/or dry) etch process, selectively etch the material of the substrate 210. In furtherance of the embodiments, the gate stack 220, the gate spacers 234, and the STI 212 collectively function as an etching hard mask, thereby forming the recesses 236 in the source and drain regions. In some examples, an etchant such as carbon tetrafluoride (CF4), tetramethylammonium hydroxide (THMA), other suitable etchant, or a combination thereof is used to form the recesses 236.

Thereafter, the recesses 132 are filled with a semiconductor material by epitaxially growing S/D features 230 in crystalline structure. The epitaxy growth may include in-situ doping to form S/D with proper dopant. In some embodiments, the epitaxy growth is a selective deposition process that involves etching during the epitaxy growth, such that the semiconductor material is substantially grown on the semiconductor surfaces in the recess 236. Particularly, the selective deposition process involves chlorine for etching effect and makes the deposition selective. The selective deposition process is designed and tuned to epitaxially grow such that the S/D 230 formed in the recesses 236 include the semiconductor material in a crystalline structure. The semiconductor material is different from that of the substrate 210. For example, the semiconductor material includes silicon carbide or silicon germanium while the substrate 210 is a silicon substrate. In some embodiments, the semiconductor material is chosen for proper strained effect in the channel region such that the corresponding carrier mobility is increased. In one example, the active region 214 is for a pFET, the semiconductor material is silicon germanium doped with boron for S/D 230 while the substrate 210 is a silicon substrate. In another example, the active region 214 is for an nFET, the semiconductor material is silicon carbide doped with phosphorous for S/D 230 while the substrate 210 is a silicon substrate.

Figure 17:
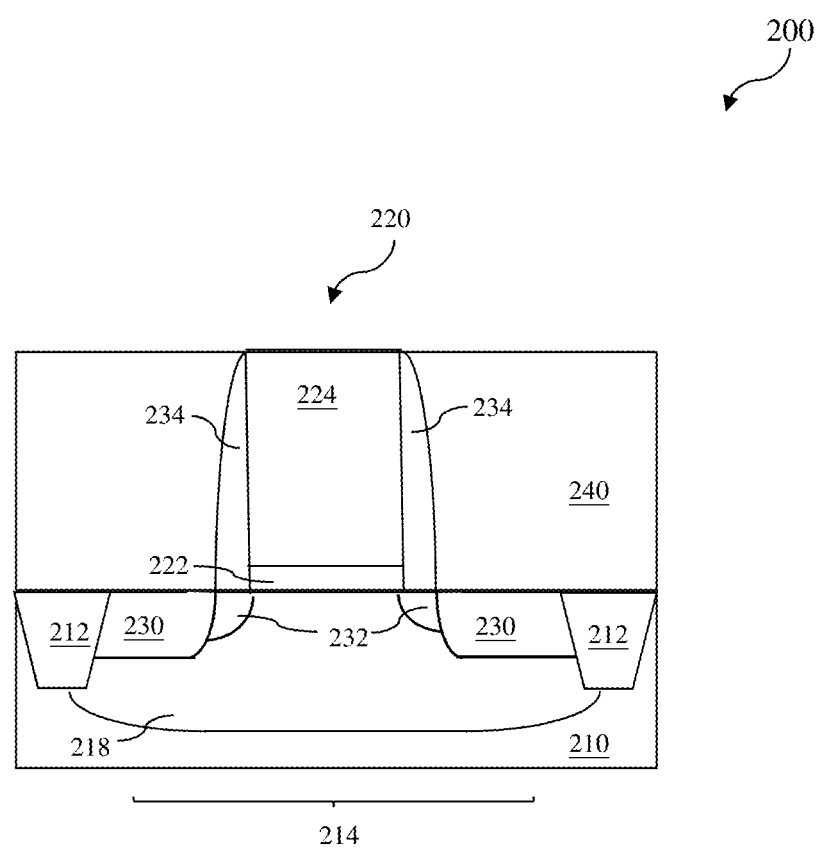

Referring to FIG. 17, the method 150 proceeds to an operation 158 by forming an interlayer dielectric (ILD) 240 on the substrate and the gate stack 220. The ILD 240 is deposited by a proper technique, such as CVD. The ILD 240 includes a dielectric material, such as silicon oxide, low k dielectric material or a combination. Then a chemical mechanical polishing (CMP) process may be applied thereafter to polarize the surface of the ILD 240. In one example, the gate stack is exposed by the CMP process for the subsequent processing steps. In another example that the hard mask to pattern the gate stack 220 is not removed at the previous operation, the CMP removes the hard mask as well. Alternatively the CMP stops on the hard mask and the hard mask is removed thereafter by an etch process.

Figure 18:
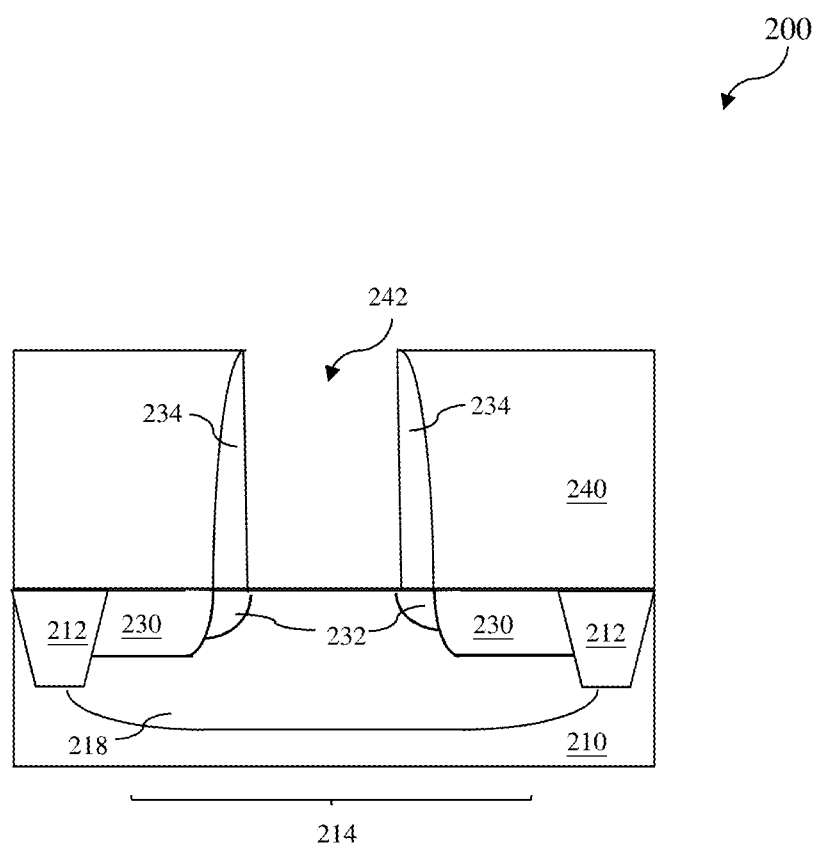

Referring to FIG. 18, the method 150 proceeds to an operation 160 by removing the gate stack 220 partially or completely, resulting in a gate trench 242. The operation 110 includes one or more etching steps to selectively remove the gate conductive layer 224 or alternatively the gate stack 220 by a suitable etching process, such as one or more wet etch, dry etch or a combination.

Figure 19:
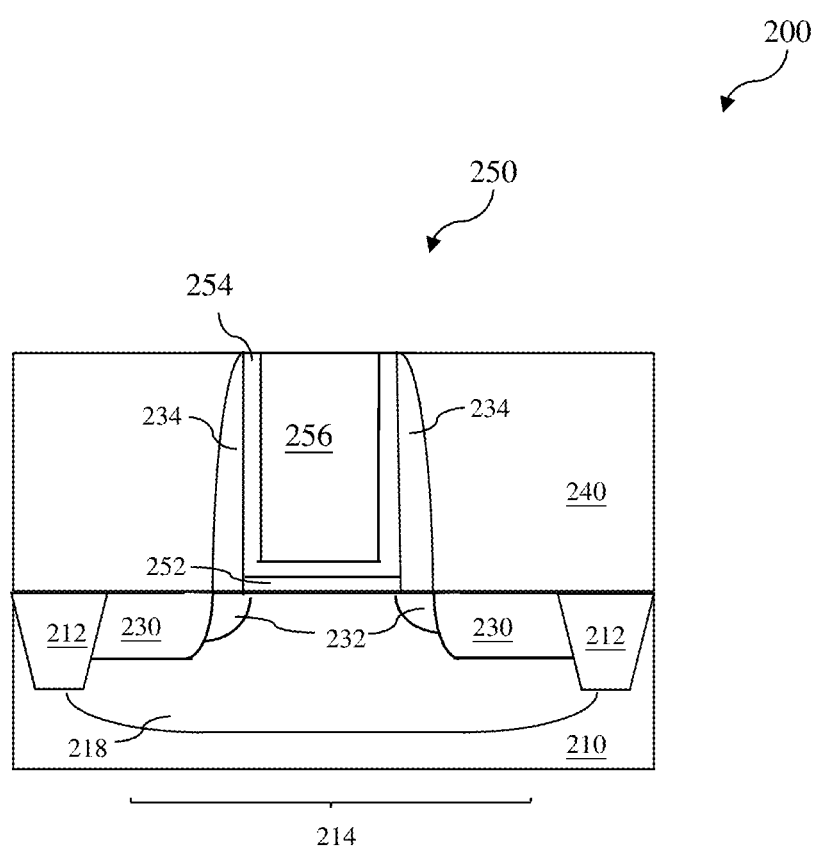
Figure 20:
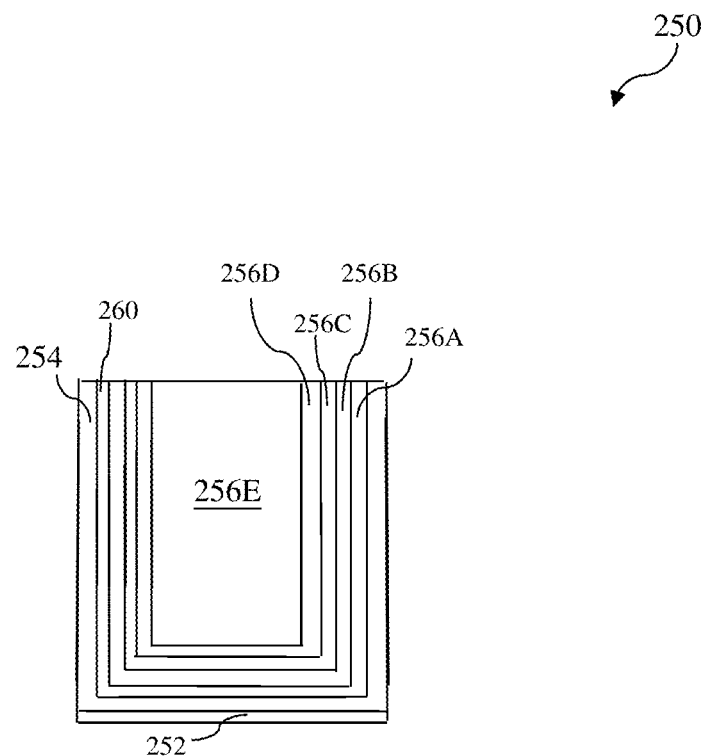
FIG. 20 is a sectional view of the semiconductor structure of FIG. 19, in portion, constructed in accordance with some embodiments.

Referring to FIG. 19, the method 150 proceeds to an operation 162 by forming one or more metal gates 250. The operation 162 includes filling various gate material layers in the gate trench 242, and performing a CMP process to remove excessive gate materials, thereby forming a metal gate 250 in the gate trench 242. In some embodiments such as in high-k last process, the gate material layers includes a gate dielectric layer 254 and a gate conductive layer (or gate electrode) 256. The gate dielectric layer 254 includes a high-k dielectric material. The gate conductive layer 256 includes metal. In some embodiments, the gate conductive layer 256 include multiple layers, such as a capping layer, a work function metal layer, a blocking layer and a filling metal layer (such as aluminum or tungsten). The gate material layers may further include an interfacial layer 252, such as silicon oxide, interposed between the substrate 210 and the high-k dielectric material. The interfacial layer 252 is a portion of the gate dielectric layer. The various gate material layers are filled in the gate trench 242 by deposition, such as CVD, PVD, plating, ALD or other suitable techniques.

The high-k dielectric layer 252 includes a dielectric material having the dielectric constant higher than that of thermal silicon oxide, about 3.9. The high k dielectric layer 252 is formed by a suitable process such as ALD. Other methods to form the high k dielectric material layer include MOCVD, PVD, UV-Ozone Oxidation or MBE. In one embodiment, the high k dielectric material includes HfO2. Alternatively, the high k dielectric material layer 252 includes metal nitrides, metal silicates or other metal oxides.

In one embodiment illustrated in FIG. 20 in a sectional view, the gate electrode 256 includes a capping layer 256A, a blocking layer 256B, a work function metal layer 256C, another blocking layer 256D and a filling metal layer 256E. In furtherance of the embodiments, the capping layer 156A includes titanium nitride, tantalum nitride, or other suitable material, formed by a proper deposition technique such as ALD. The blocking layer 256B includes titanium nitride, tantalum nitride, or other suitable material, formed by a proper deposition technique such as ALD.

The work functional metal layer 256C includes a conductive layer of metal or metal alloy with proper work function such that the corresponding FET is enhanced for its device performance. The work function (WF) metal layer 256C is different for a pFET and a nFET, respectively referred to as an n-type WF metal and a p-type WF metal. The choice of the WF metal depends on the FET to be formed on the active region 214. For example, the semiconductor structure 200 includes a first active region 214 for an nFET and another active region for an pFET, and accordingly, the n-type WF metal and the p-type WF metal are respectively formed in the corresponding gate stacks. Particularly, An n-type WF metal is a metal having a first work function such that the threshold voltage of the associated nFET is reduced. The n-type WK metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher.

In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

The blocking layer 256D includes titanium nitride, tantalum nitride, or other suitable material, formed by a proper deposition technique such as ALD. In various embodiments, the filling metal layer 256E includes aluminum, tungsten or other suitable metal. The filling metal layer 256E is deposited by a suitable technique, such as PVD or plating.

The method 150 proceeds to an operation 162 by form the contact features. The operation 162 includes forming contact holes (such as the operation 32 of the method 20 in FIG. 1), reducing the contact resistance by introducing the metal doping species to the S/D features (such as forming the MSC features 92 and 94 according to some embodiments), forming the silicide features (such as the operation 38 of the method 20 in FIG. 1), and forming the metal plugs in the contact holes (such as by metal deposition and CMP). Especially, the introducing the metal doping species to the S/D features may be implemented by one of the methods (20, 100, 110 and 120). For examples, the MSC features may be formed by the operation 36 in the method 20; the operation 102 in the method 100; the operation 36 in the method 110; or the operations 124 and 128 in the method 120.

Other processing steps may follow to form a functional circuit. For example, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

Even though only one gate stack 250 is shown in the figures, however, multiple gate stacks are formed on the substrate 210 and various corresponding nFETs, pFETs and other circuit devices are formed on the substrate 210. In some embodiments, the gate stack 250 is formed on the 3D fin active region and is a portion a FinFET.

The present disclosure is not limited to applications in which the semiconductor structure includes a filed effect transistor, such as a metal-oxide-silicon (MOS) transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metal. The footing procedure may implement other effective cleaning procedure. The disclosed method is used to but not limited to form one transistor, such as an n-type metal-oxide-semiconductor field-effect-transistor (nMOSFET). For example, a plurality of nMOSFETs and a plurality of p-type metal-oxide-semiconductor field-effect-transistors (pMOSFETs) are formed in the same substrate, the nMOSFETs and pMOSFETs are formed in a collective procedure where some features are respectively formed. In a particular example, the n-type WF metal is formed in the nMOSFET regions while pMOSFET regions are covered from the deposition of n metal.

In another embodiment, the semiconductor substrate may include an epitaxial layer. For example, the substrate may have an epitaxial layer overlying a bulk semiconductor. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

The present disclosure provides a semiconductor structure and method making the same. The semiconductor structure includes an nFET and a pFET and contact features disposed on the S/D features, respectively. The method includes introducing metal species to the first silicide feature on the first S/D feature for the nFET and introducing the metal species to the second S/D feature for the pFET with reduced contact resistance to both. The metal species includes Ytterbium (Yb), Erbium (Er), Yttrium (Y), Selenium (Se), Platinum (Pt), Barium (Ba) or a combination thereof. In some embodiments, the metal species is introduced to both nFET and pFET by one ion implantation, thereby distributing the metal species at different levels for the nFET and pFET due to the dipole effect of the metal species and different diffusion behaviors in the different semiconductor materials.

Various advantages may present in one or more embodiments of the method 20 (or 100, or 110 or 120) and the semiconductor structure 50. For example, by performing one ion implantation process to both the nFET region and pFET region without additional patterning, the contact resistances are reduced with reduced cost. In another example, the disclosed method and the corresponding structure are applicable to the advanced technology nodes, such as 10 nm or less while the existing method experiences various issues (such as threshold voltage shift and the constrains of the limited contact areas) in the advanced technology nodes.

Thus, the present disclosure provides a method in accordance with some embodiments. The method includes providing a semiconductor substrate having a first region and a second region; forming a first gate within the first region and a second gate within the second region on the semiconductor substrate; forming first source/drain features of a first semiconductor material with an n-type dopant in the semiconductor substrate within the first region; forming second source/drain features of a second semiconductor material with a p-type dopant in the semiconductor substrate within the second region. The second semiconductor material is different from the first semiconductor material in composition. The method further includes forming first silicide features to the first source/drain features and second silicide features to the second source/drain features; and performing an ion implantation process of a species to both the first and second regions, thereby introducing the species to first silicide features and the second source/drain features.

The present disclosure provides a method in accordance with some other embodiments. The method includes providing a semiconductor substrate having a first region and a second region; forming a first doped feature of a first semiconductor material with an n-type dopant in the semiconductor substrate within the first region; forming a second doped feature of a second semiconductor material with a p-type dopant in the semiconductor substrate within the second region, wherein the second semiconductor material is different from the first semiconductor material in composition; and performing an ion implantation process using Ytterbium (Yb) to both the first and second regions, thereby introducing Yb to the first doped feature at a first depth and to the second doped feature at a second depth, wherein the second depth is greater than the first depth.

The present disclosure provides a semiconductor structure in accordance with some embodiments. The semiconductor structure includes a semiconductor substrate having a first region and a second region; a first source/drain feature formed in the semiconductor substrate within the first region, wherein the first source/drain feature includes a first semiconductor material with an n-type dopant; a second source/drain feature formed in the semiconductor substrate within the second region, wherein the second source/drain feature includes a second semiconductor material with a p-type dopant, and the second semiconductor material is different from the first semiconductor material in composition; and a first silicide feature disposed on the first source/drain feature and a second silicide feature disposed on the a second source/drain feature, wherein the first silicide feature is doped by a doping species and the second source/drain feature is doped by the doping species.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a semiconductor substrate having a first region and a second region;
forming a first gate within the first region and a second gate within the second region on the semiconductor substrate;
forming first source/drain features of a first semiconductor material with an n-type dopant in the semiconductor substrate within the first region, wherein the first source/drain features are interposed by the first gate;
forming second source/drain features of a second semiconductor material with a p-type dopant in the semiconductor substrate within the second region, wherein the second source/drain features are interposed by the second gate and the second semiconductor material is different from the first semiconductor material in composition;
forming first silicide features to the first source/drain features and second silicide features to the second source/drain features; and
performing an ion implantation process of a species to both the first and second regions, thereby introducing the species to first source/drain features and the second source/drain features.

2. The method of claim 1, wherein the performing of the ion implantation process of the species to both the first and second regions includes diffusing the species slower in the first source/drain feature within the first region and diffusing the species faster in the second source/drain features within the second region.

3. The method of claim 2, wherein the performing of the ion implantation process of the species to both the first and second regions includes performing an annealing process to activate the first and second source/drain features and diffusing the species.

4. The method of claim 3, wherein the performing of the annealing process includes performing millisecond anneal (MSA) process.

5. The method of claim 1, wherein the performing of the ion implantation process of the species to both the first and second regions includes performing the ion implantation with Ytterbium (Yb) as the species.

6. The method of claim 5, wherein the performing of the ion implantation process of the species includes performing a Yb ion implantation with an energy ranging between 0.5 keV and 2.5 keV and a dose ranging between $5 \times 10^{13}$ cm$^{-2}$ and $10^{15}$ cm$^{-2}$.

7. The method of claim 1, wherein the performing of the ion implantation process of the species to both the first and second regions includes performing the ion implantation with the species selected from the group consisting of Erbium (Er), Yttrium (Y), Selenium (Se), Platinum (Pt) and Barium (Ba).

8. The method of claim 1, further comprising performing a pre-amorphized implantation (PAI) process to the first and second source/drain features in the second region, prior to the performing of the ion implantation process of the species to both the first and second regions.

9. The method of claim 8, wherein the performing of the PAI process includes performing an ion implantation by an ion species selected from the group consisting of silicon, germanium and a combination thereof.

10. The method of claim 1, wherein the forming of the first silicide features to the first source/drain features and the second silicide features to the second source/drain features includes:
depositing a titanium film on the first and second source/drain features;
depositing a titanium nitride film on the titanium film; and
reacting the titanium film with first semiconductor material in the first region and the second semiconductor material in the second region, thereby forming the first silicide features on the first source/drain features and the second silicide features on the second source/drain features.

11. The method of claim 1, wherein the forming of the first source/drain features of the first semiconductor material includes forming the first source/drain features with the first semiconductor material selected the group consisting of silicon and silicon carbide; and
wherein the forming of the second source/drain features of the second semiconductor material with the second semiconductor material selected from the group consisting of silicon germanium and silicon.

12. The method of claim 1, further comprising forming contact holes aligned with the first and second source/drain features using a self-aligned-contact process that includes performing an etching process using a gate hard mask and a gate spacer as a collective etch mask.

13. A method, comprising:
providing a semiconductor substrate having a first region and a second region;
forming a first doped feature of a first semiconductor material with an n-type dopant in the semiconductor substrate within the first region;
forming a second doped feature of a second semiconductor material with a p-type dopant in the semiconductor substrate within the second region, wherein the second semiconductor material is different from the first semiconductor material in composition; and
performing an ion implantation process using Ytterbium (Yb) to both the first and second regions, thereby introducing Yb to the first doped feature at a first depth and to the second doped feature at a second depth, wherein the second depth is greater than the first depth.

14. The method of claim 13, further comprising performing an annealing process to activate the first and second doped features and diffusing Yb.

15. The method of claim 13, wherein the performing of the ion implantation process includes performing a Yb ion implantation with an energy ranging between 0.5 keV and 2.5 keV and a dose ranging between $5 \times 10^{13}$ cm$^{-2}$ and $10^{15}$ cm$^{-2}$.

16. The method of claim 13, further comprising:
performing a pre-amorphorized implantation (PAI) process to the semiconductor substrate before the performing of the ion implantation process using Yb; and
performing a millisecond anneal (MSA) process the semiconductor substrate after the performing of the ion implantation process using Yb.

17. A method comprising:
forming a first source/drain feature of a first semiconductor material with a first type dopant in a semiconductor substrate;
forming a second source/drain feature of a second semiconductor material with a second type dopant in the semiconductor substrate, wherein the second semiconductor material is different from the first semiconductor material in composition and the second type dopant is opposite the first type dopant;
implanting a dopant species into the first source/drain feature and the second source/drain feature such that the dopant species in the first source/drain feature extends to a first depth within the first source/drain feature and the dopant species in the second source/drain feature extends to a second depth within the second source/drain feature that is different than the first depth; and
after implanting the dopant species into the first source/drain feature and the second source/drain feature, forming a first silicide feature on the first source/drain feature and second silicide feature on the second source/drain feature.

18. The method of claim 17, wherein the dopant species is a dopant selected from the group consisting of Erbium (Er), Yttrium (Y), Platinum (Pt), or Barium (Ba).

19. The method of claim 17, wherein the dopant species is Ytterbium (Yb).

20. The method of claim 17, further comprising performing a pre-amorphorized implantation process to the first source/drain feature to form a first amorphous region in the first source/drain feature and performing the pre-amorphorized implantation process to the second source/drain feature to form a second amorphous region in the second source/drain feature, the first amorphous region extending to a third depth within the first source/drain feature that is different than the first depth and the second amorphous region extending to a fourth depth within the second source/drain feature that is different than the second depth.

* * * * *